(12) United States Patent
Lee et al.

(10) Patent No.: US 10,886,180 B2
(45) Date of Patent: Jan. 5, 2021

(54) SEMICONDUCTOR DEVICE WITH FIN END SPACER AND METHOD OF MANUFACTURING THE SAME

(71) Applicant: TAIWAN SEMICONDUCTOR MANUFACTURING CO., LTD., Hsinchu (TW)

(72) Inventors: Tung Ying Lee, Hsinchu (TW); Tzu-Chung Wang, Hsinchu (TW); Kai-Tai Chang, Kaohsiung (TW); Wei-Sheng Yun, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/426,428

(22) Filed: May 30, 2019

(65) Prior Publication Data

US 2020/0098876 A1    Mar. 26, 2020

Related U.S. Application Data

(60) Provisional application No. 62/734,519, filed on Sep. 21, 2018.

(51) Int. Cl.
*H01L 21/8234* (2006.01)
*H01L 29/417* (2006.01)
*H01L 29/423* (2006.01)
*H01L 29/66* (2006.01)
*H01L 29/04* (2006.01)
*H01L 29/78* (2006.01)

(52) U.S. Cl.
CPC ...... *H01L 21/823431* (2013.01); *H01L 29/04* (2013.01); *H01L 29/41791* (2013.01); *H01L 29/42356* (2013.01); *H01L 29/6681* (2013.01); *H01L 29/66795* (2013.01); *H01L 29/785* (2013.01); *H01L 2029/7858* (2013.01)

(58) Field of Classification Search
None
See application file for complete search history.

(56) References Cited

U.S. PATENT DOCUMENTS

2015/0171193 A1*   6/2015  Cheng ............... H01L 29/7848
                                                    438/197
2015/0318399 A1*  11/2015  Jeong ............... H01L 29/0653
                                                    257/401

* cited by examiner

*Primary Examiner* — Cheung Lee
(74) *Attorney, Agent, or Firm* — McDermott Will & Emery LLP

(57) ABSTRACT

A semiconductor device and a method of manufacturing the same are disclosed. The semiconductor device includes a plurality of fins on a substrate. A fin end spacer is formed on an end surface of each of the plurality of fins. An insulating layer is formed on the plurality of fins. A source/drain epitaxial layer is formed in a source/drain space in each of the plurality of fins. A gate electrode layer is formed on the insulating layer and wrapping around the each channel region. Sidewall spacers are formed on the gate electrode layer.

20 Claims, 18 Drawing Sheets

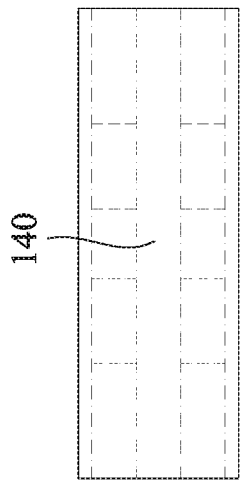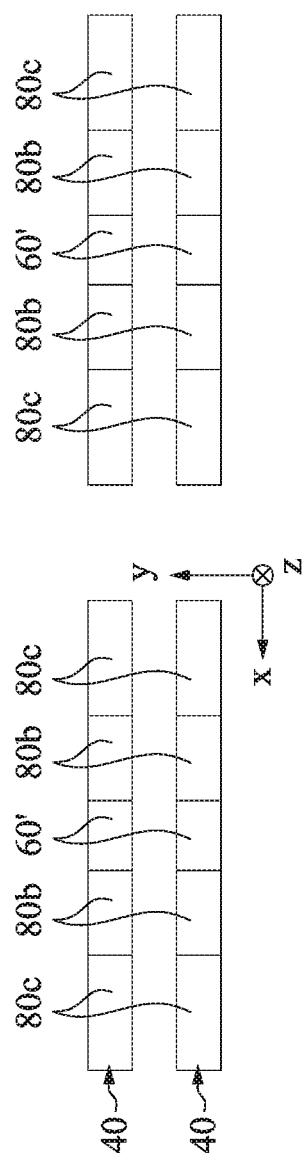

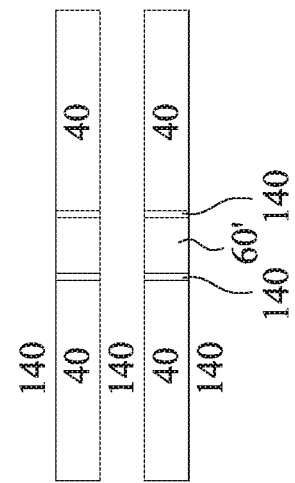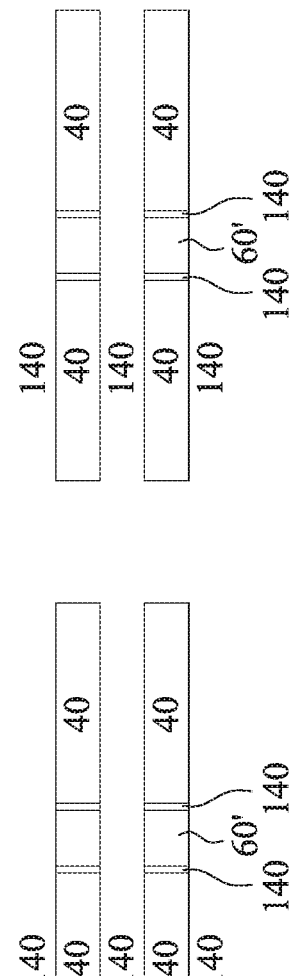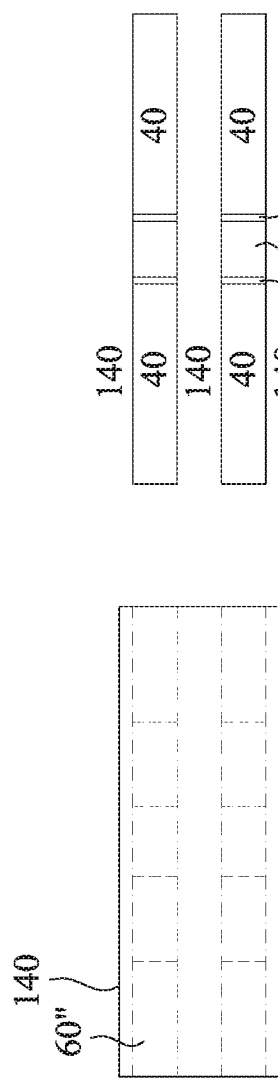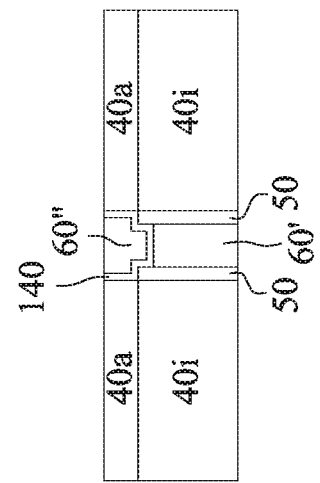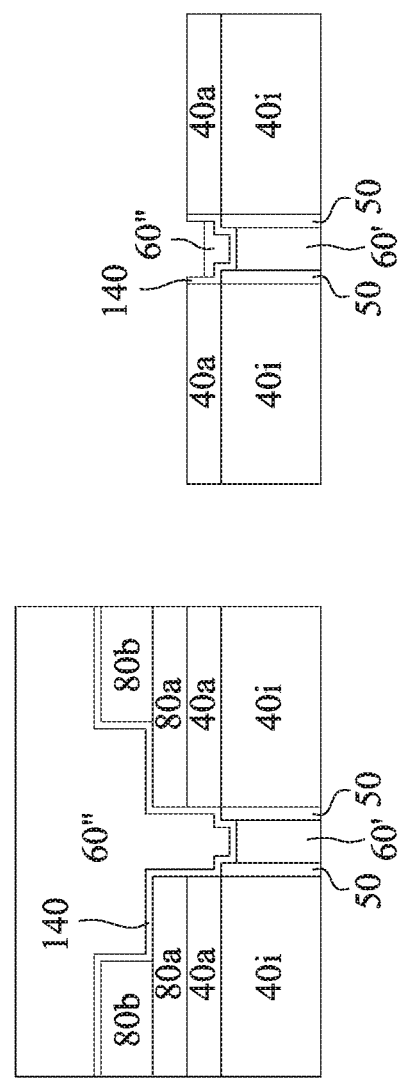

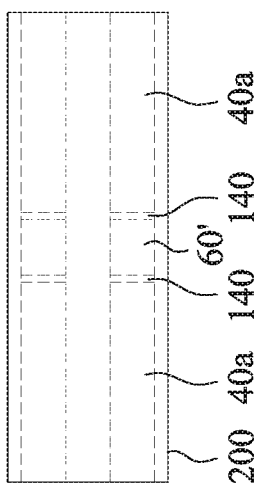
FIG. 15A
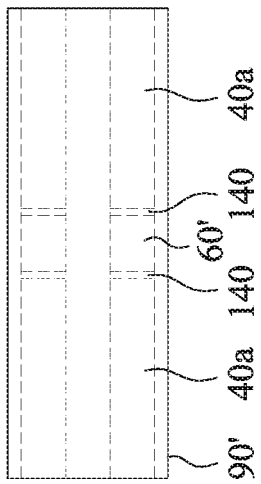
FIG. 16A
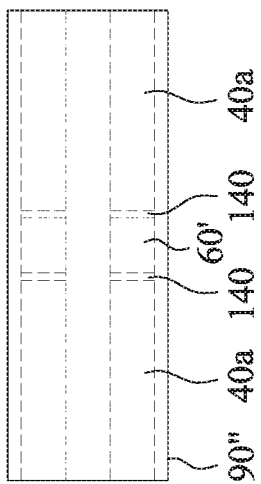
FIG. 17A
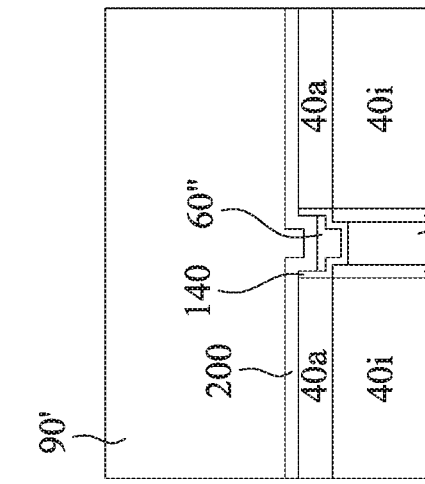
FIG. 15B
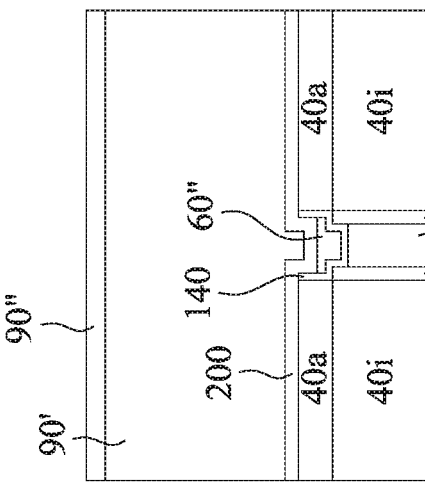
FIG. 16B
FIG. 17B

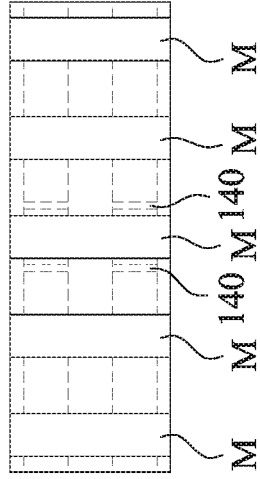
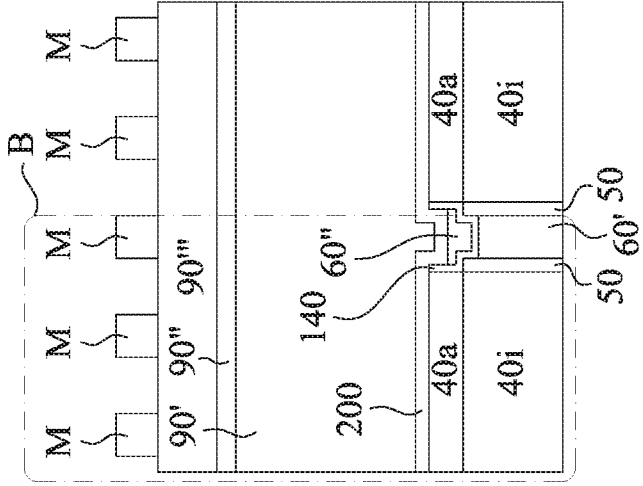
FIG. 18A
FIG. 18B
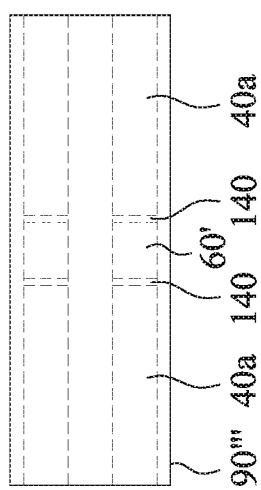
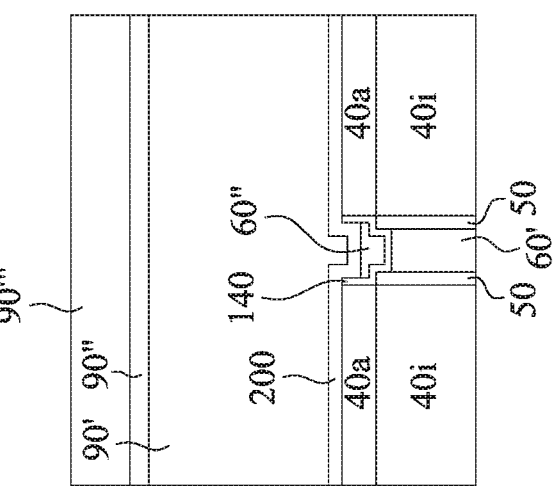
FIG. 19A
FIG. 19B

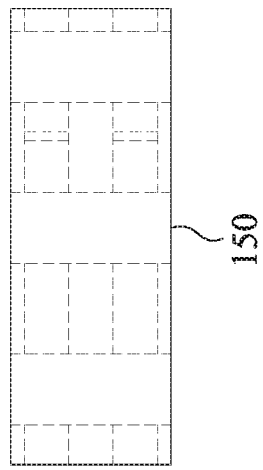
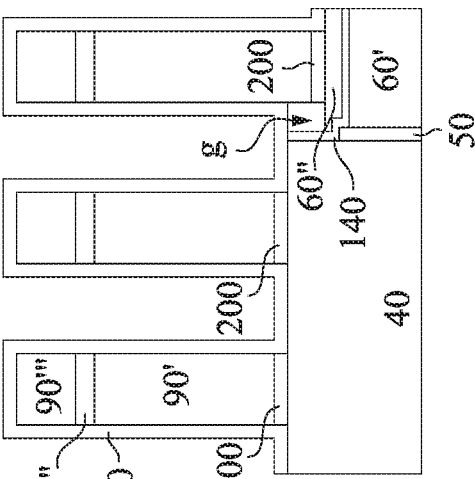
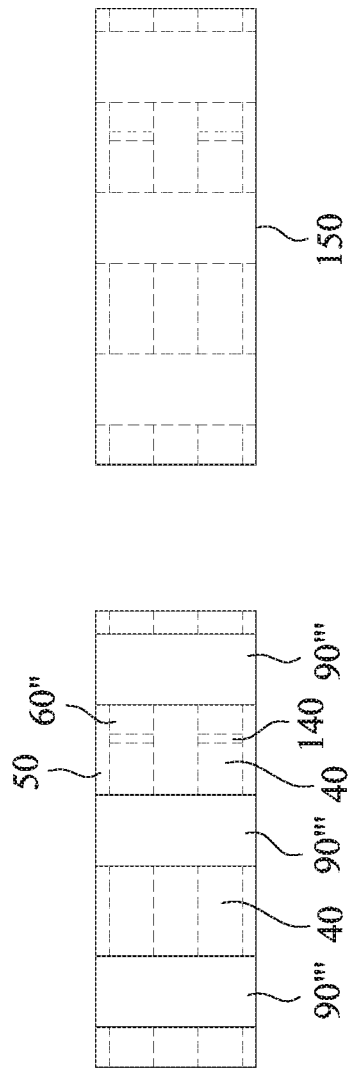
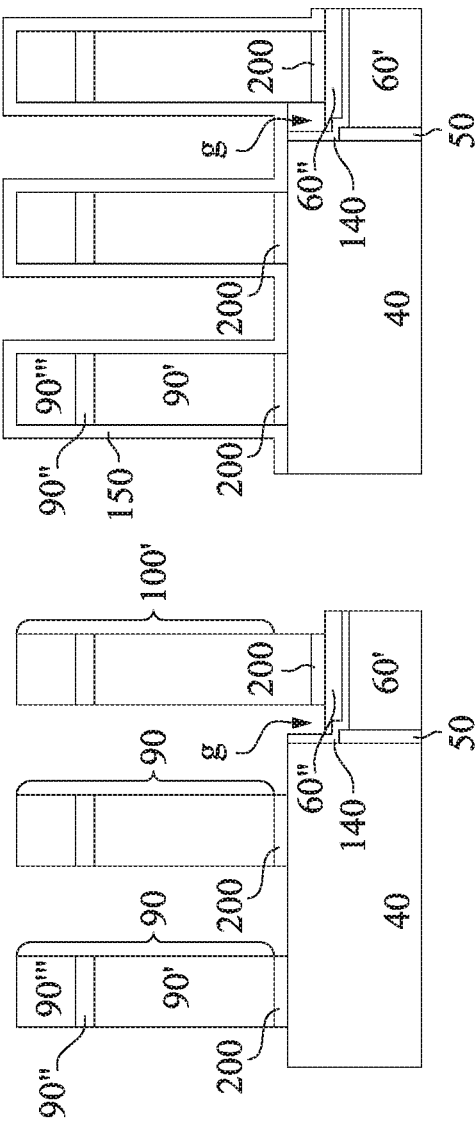
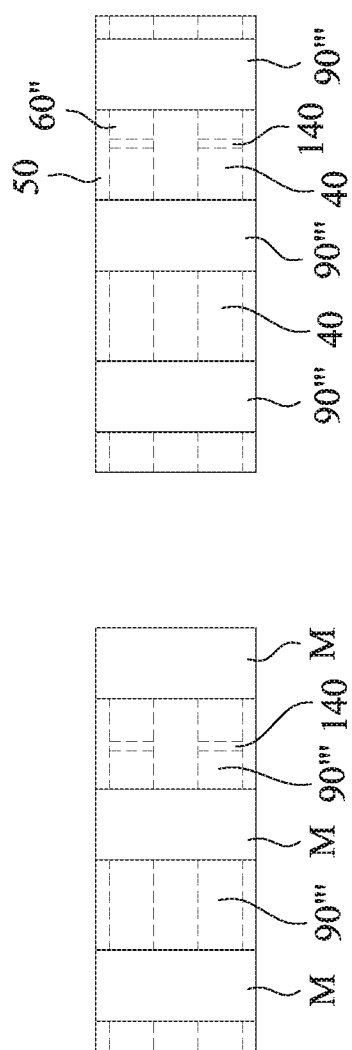
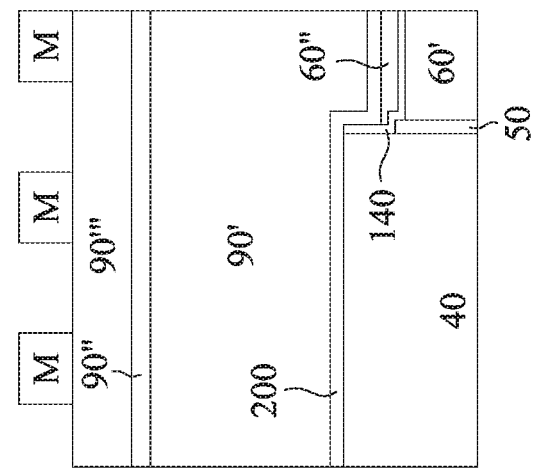

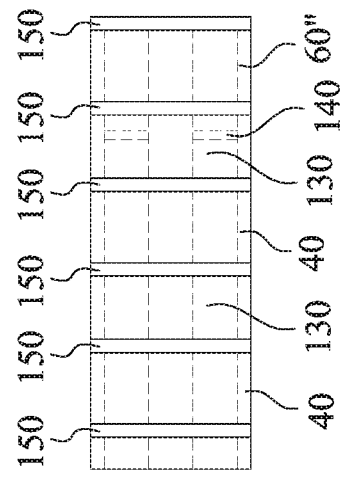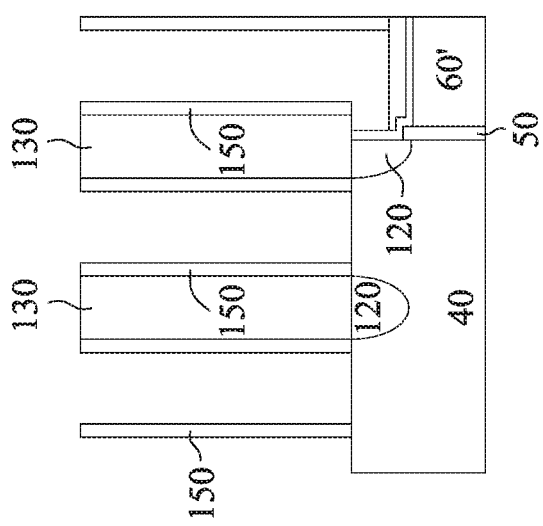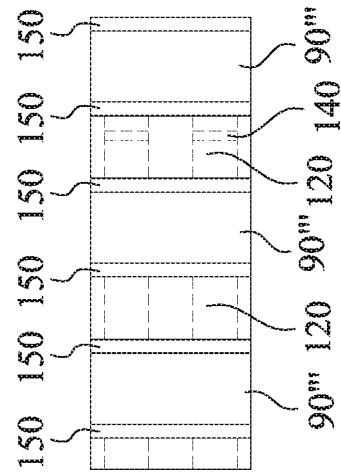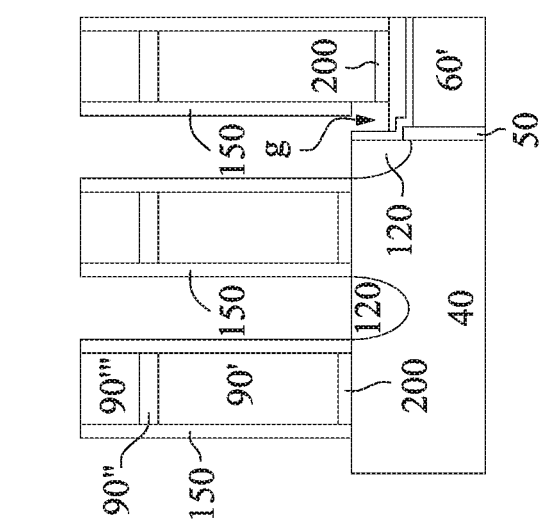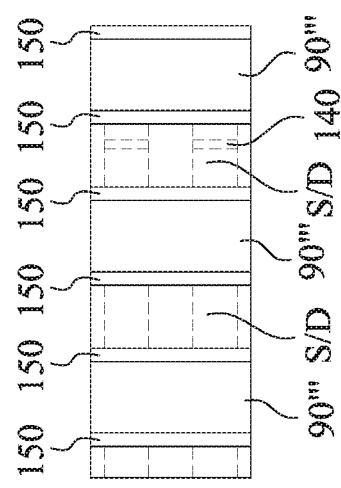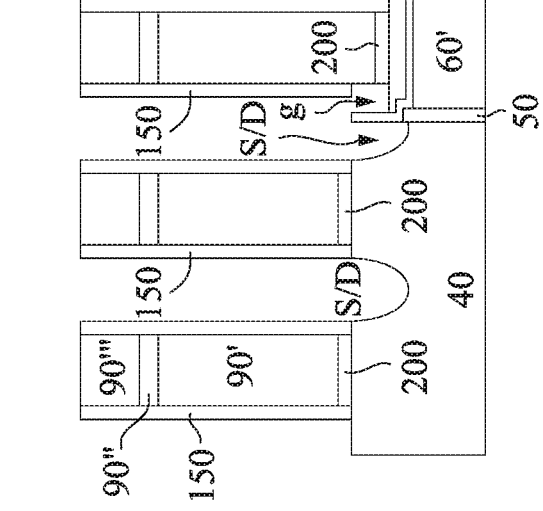

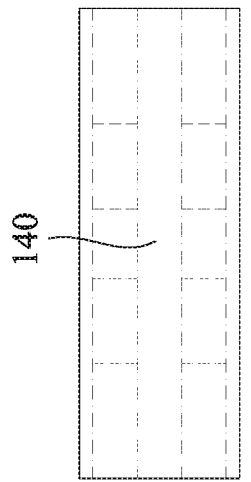
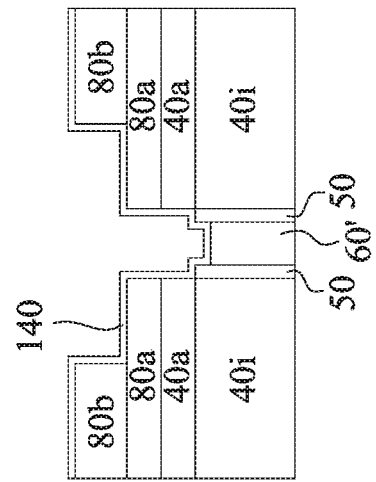
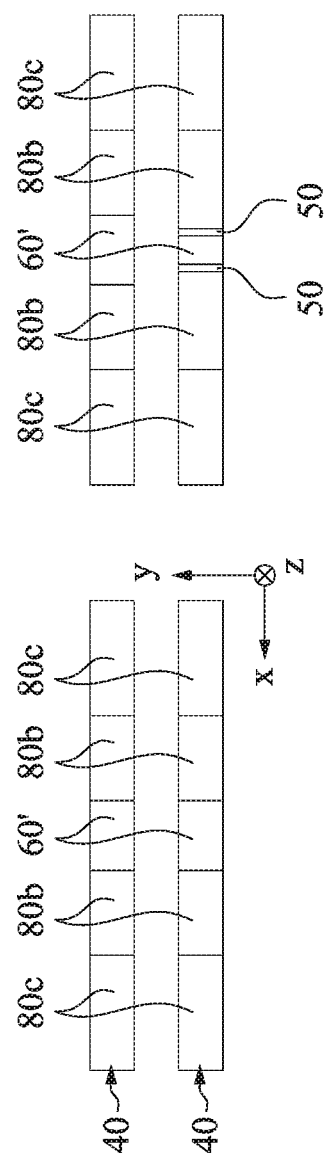
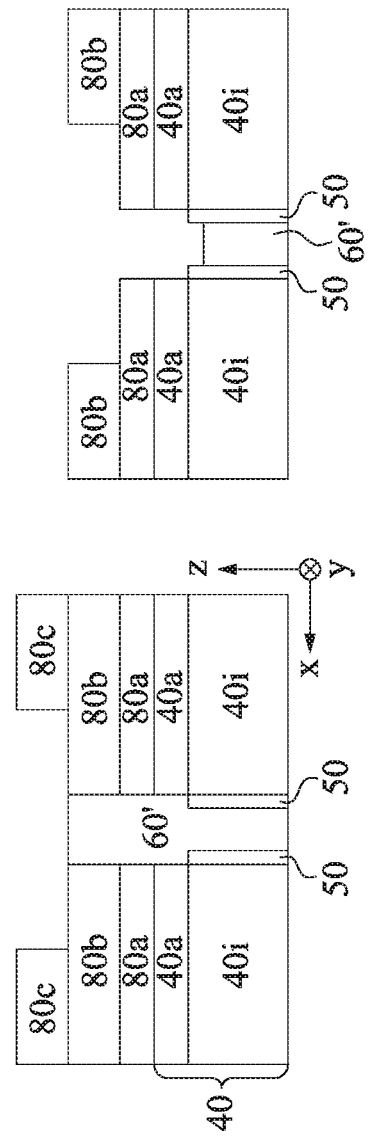

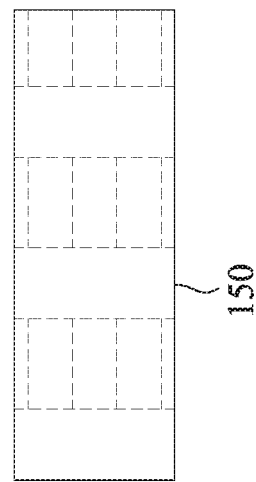
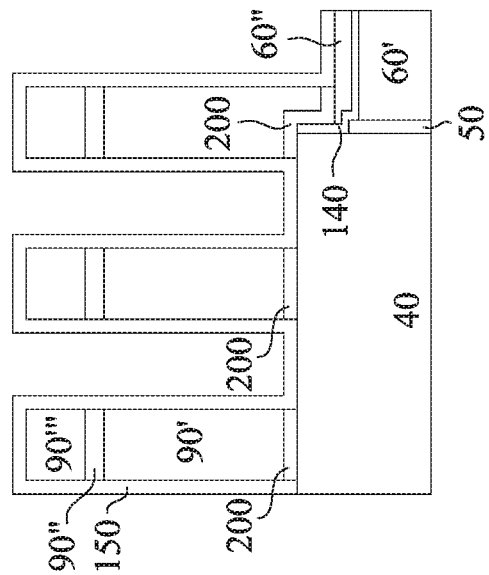
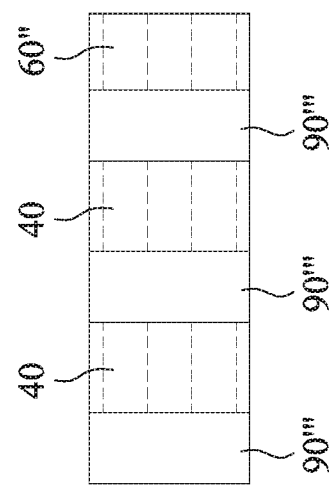
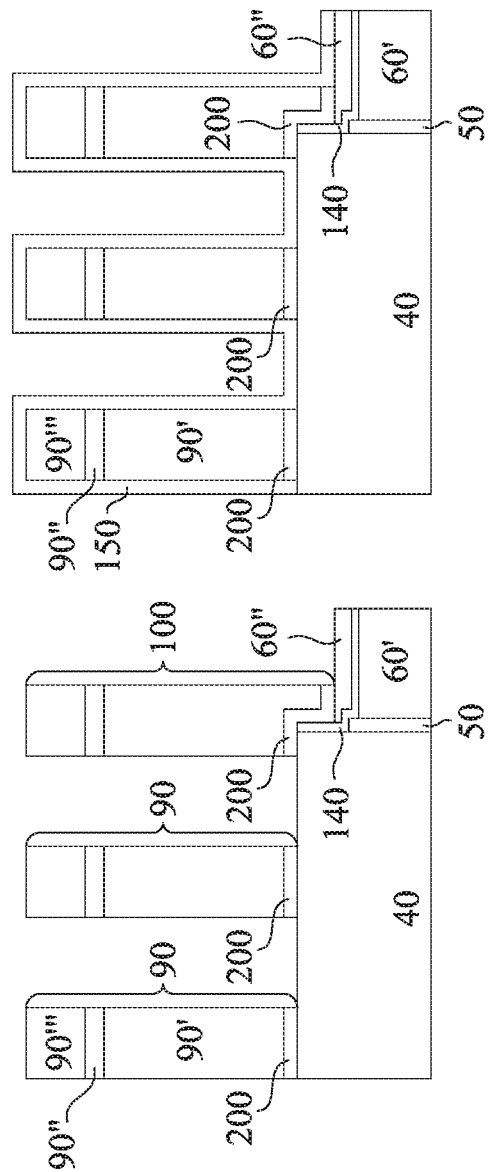
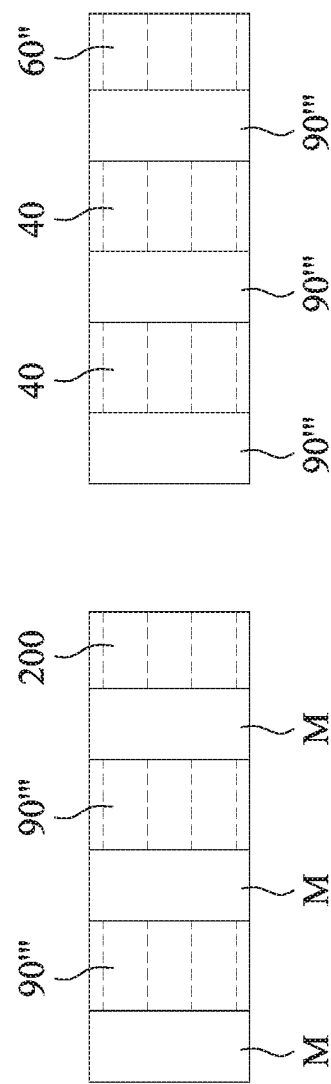
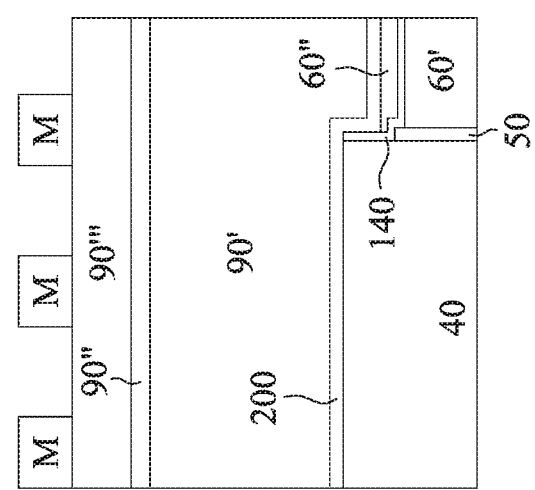

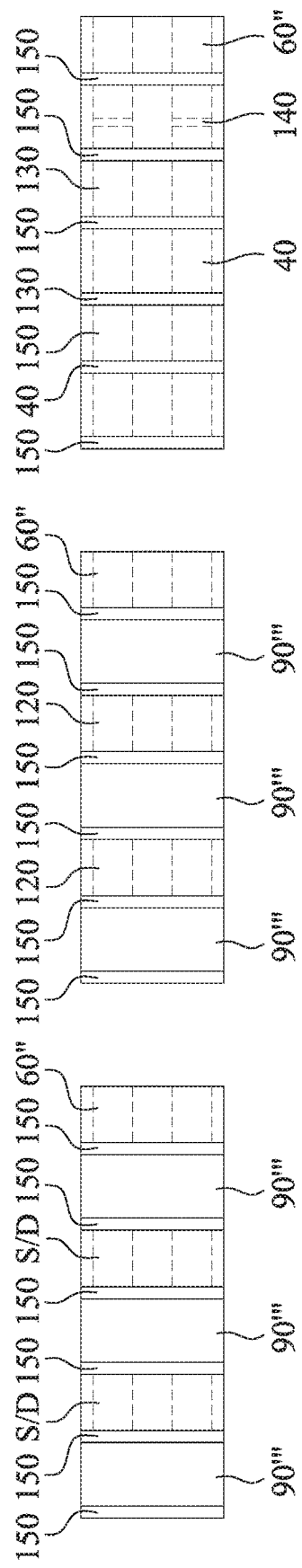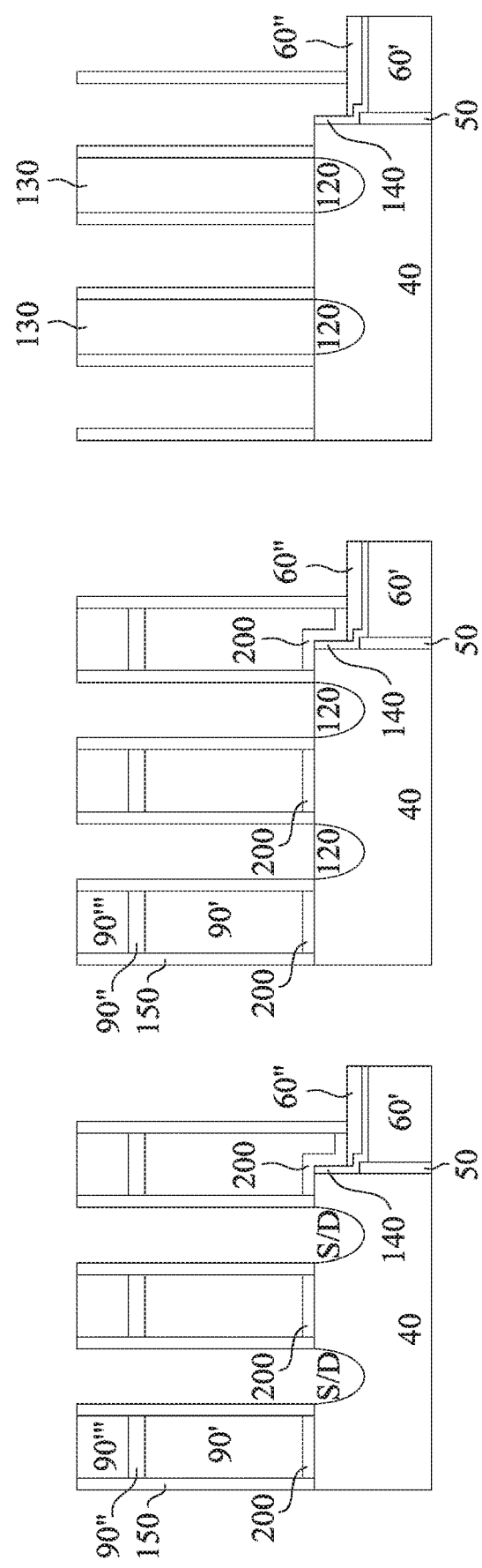
FIG. 44A FIG. 44B
FIG. 43A FIG. 43B
FIG. 42A FIG. 42B

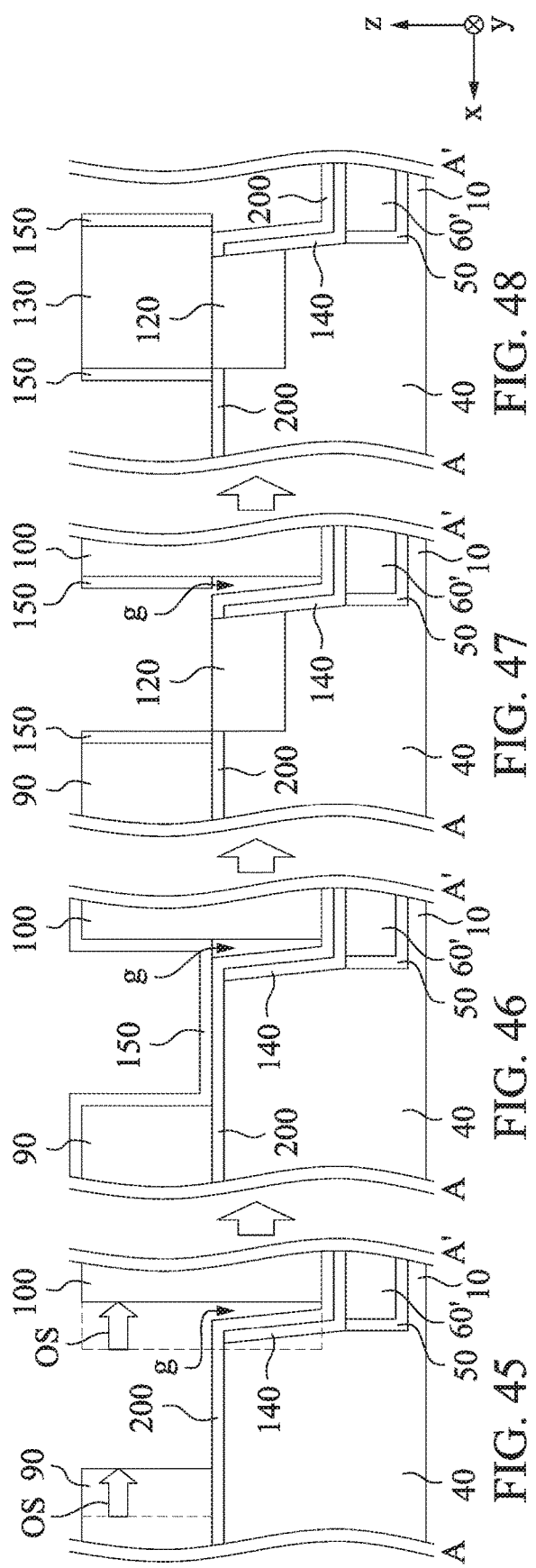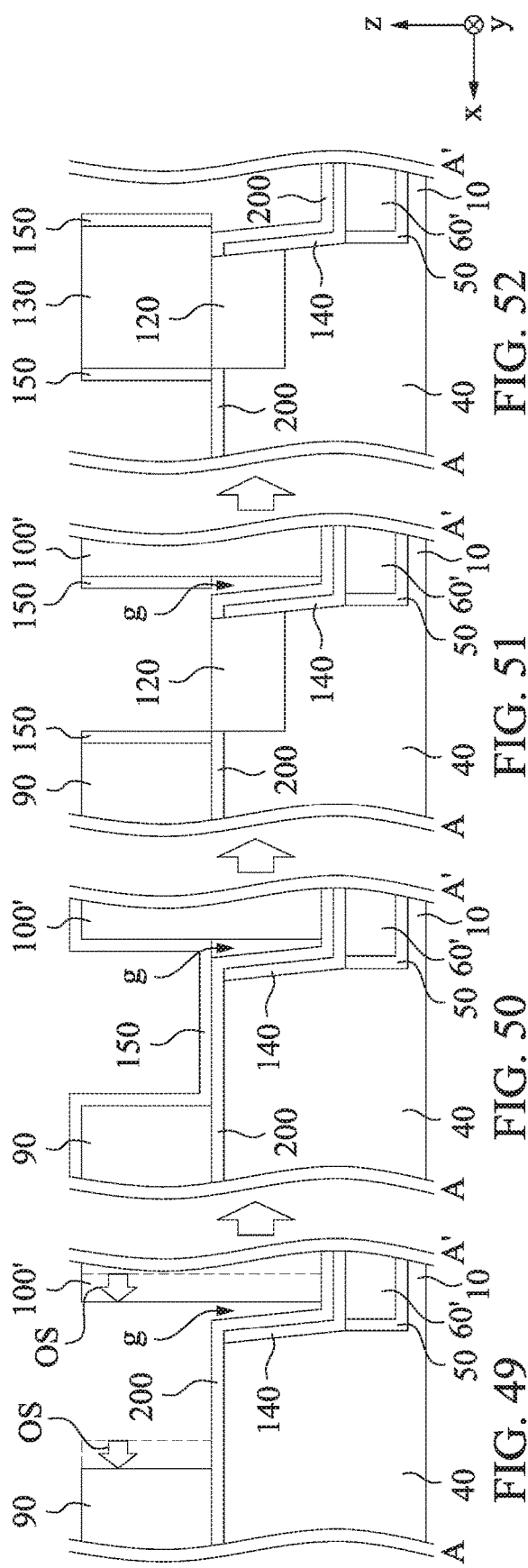

US 10,886,180 B2

SEMICONDUCTOR DEVICE WITH FIN END SPACER AND METHOD OF MANUFACTURING THE SAME

RELATED APPLICATION

This application claims priority to U.S. Provisional Patent Application No. 62/734,519 filed on Sep. 21, 2018, the entire contents of which are incorporated herein by reference.

TECHNICAL FIELD

The disclosure relates to methods of manufacturing fin field effect transistors (FinFETs) and/or gate-all-around (GAA) field effect transistors (FETs) for semiconductor integrated circuits, and more particularly to methods of manufacturing fin end spacers to protect a source/drain epitaxial layer, and semiconductor devices.

BACKGROUND

Traditional planar thin film devices provide superior performance with low power consumption. To enhance the device controllability and reduce the substrate surface area occupied by the planar devices, the semiconductor industry has progressed into nanometer technology process nodes in pursuit of higher device density, higher performance, and lower costs. Challenges from both fabrication and design issues have resulted in the development of three-dimensional designs, such as a multi-gate field effect transistor (FET), including a fin field effect transistor (FinFET) and a gate-all-around (GAA) field effect transistor (FET). In a FinFET, a gate electrode is adjacent to three side surfaces of a channel region with a gate dielectric layer interposed therebetween. Because the gate structure surrounds (wraps) the fin on three surfaces (i.e., the top surface and the opposite lateral surfaces), the transistor essentially has three gates controlling (one gate at each of the top surface and the opposite lateral surfaces) the current through the fin or channel region. The fourth side of the bottom of the channel is far away from the gate electrode and thus is not under close gate control. In contrast, in a GAA FET, all side surfaces (i.e. the top surface, the opposite lateral surfaces, and the bottom surface) of the channel region are surrounded by the gate electrode, which allows for fuller depletion in the channel region and results in reduced short-channel effect due to steeper sub-threshold current swing (SS) and smaller drain induced barrier lowering (DIBL). As transistor dimensions are continually scaled down to sub 10-15 nm technology nodes, further improvements of the FinFETs and/or GAA FETs are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 9A, 9B, 10A, 10B, 11A, 11B, 12A, 12B, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 24A, 24B, 25A, and 25B show operations of manufacturing a semiconductor FinFET device according to an embodiment of the present disclosure. Each of the FIGS. 9A, 10A, 11A, 12A, 13A, 14A, 15A, 16A, 17A, 18A, 19A, 20A, 21A, 22A, 23A, 24A, and 25A includes a top plan view and each of the FIGS. 9B, 10B, 11B, 12B, 13B, 14B, 15B, 16B, 17B, 18B, 19B, 20B, 21B, 22B, 23B, 24B, and 25B includes a cross-sectional view of the semiconductor FinFET device along a cut line A-A in a plane including x and z axes of FIG. 7.

FIGS. 28A, 28B, 29A, 29B, 30A, 30B, 31A, 31B, 32A, 32B, 33A, 33B, 34A, 34B, 35A, 35B, 36A, 36B, 37A, 37B, 38A, 38B, 39A, 39B, 40A, 40B, 41A, 41B, 42A, 42B, 43A, 43B, 44A, and 44B show operations of manufacturing a semiconductor FinFET device according to an embodiment of the present disclosure. Each of the FIGS. 28A, 29A, 30A, 31A, 32A, 33A, 34A, 35A, 36A, 37A, 38A, 39A, 40A, 41A, 42A, 43A, and 44A includes a top plan view and each of the FIGS. 28B, 29B, 30B, 31B, 32B, 33B, 34B, 35B, 36B, 37B, 38B, 39B, 40B, 41B, 42B, 43B, and 44B includes a cross-sectional view of the semiconductor FinFET device along a cut line A-A in a plane including x and z axes of FIG. 1.

FIGS. 45, 46, 47, and 48 show cross-sectional views of various stages of manufacturing a semiconductor device.

FIGS. 49, 50, 51, and 52 show cross-sectional views of various stages of manufacturing a semiconductor device.

DETAILED DESCRIPTION

Figure 2:
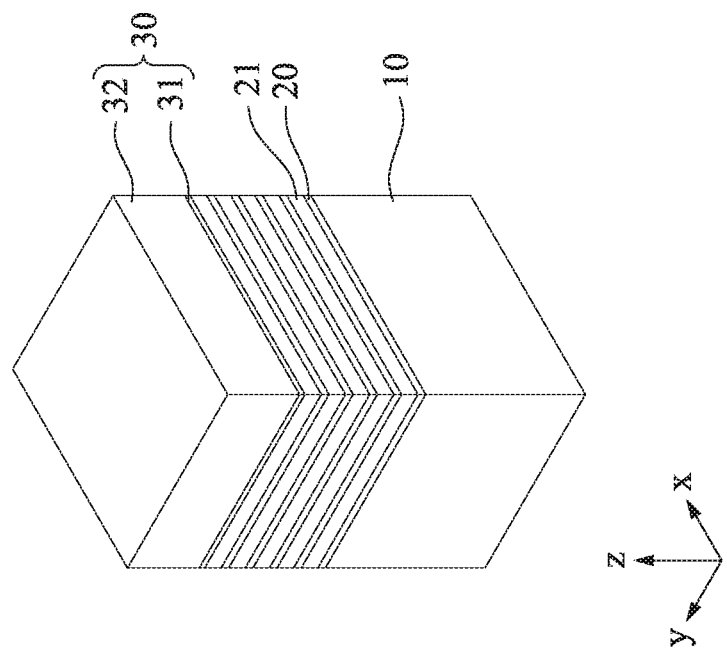
FIG. 2 shows a schematic view of stacked semiconductor layers formed over the processed substrate of FIG. 1, according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In this disclosure, a source/drain refers to a source and/or a drain. It is noted that in the present disclosure, a source and a drain are interchangeably used and the structures thereof are substantially the same.

During the manufacturing process of a semiconductor FET device having source/drain epitaxial layers, overlay shift may occur and cause misalignment of structures, e.g. dummy polycrystalline silicon structures formed on an edge of a fin end region for protection of the edge of the fin end region. The dummy polycrystalline silicon structure is called a 'dummy structure' because it can be subsequently removed and is not part of the circuitry. Overlay shift, however, may shift the position of the dummy polycrystalline silicon structure formed at the edge of a fin end region to a region away from the fin end, forming a narrow gap. This narrow gap does not allow a complete formation of a protective layer, e.g. sidewall layer, and prevents the protective layer from carrying out its designed function (e.g. shielding the source/drain epitaxial layer from etchant). This may lead to defects such as a damaged source/drain epitaxial layer by etching with a loss of material of the source/drain epitaxial layer and/or a chemical alteration of the source/drain epitaxial layer. Such defects could cause the entire wafer to be defective and, therefore, discarded. When the gap is sufficiently wide due to overlay shift, the protective layer can still be formed completely and the overlay shift does not cause the defect formation.

Much effort has been applied to model overlay so as to solve the overlay shift problem. For example, the linear overlay model is designed for such purpose. Without negligible field to field and wafer to wafer overlay variations, the total overlay shift in a specific in-plane direction along a major surface of the wafer is equal to the sum of the translation overlay parameter, magnification overlay parameter, rotation overlay parameter, and a residual overlay parameter. Along with the downscaling of device dimension to nanoscale, the control of overlay shift is critical to the critical dimension (CD) variability. Since a wide gap would provide operable devices, the embodiments of the present disclosure are directed to solving the problem of the narrow gap. Embodiments of the present disclosure are described therein.

Figure 1:
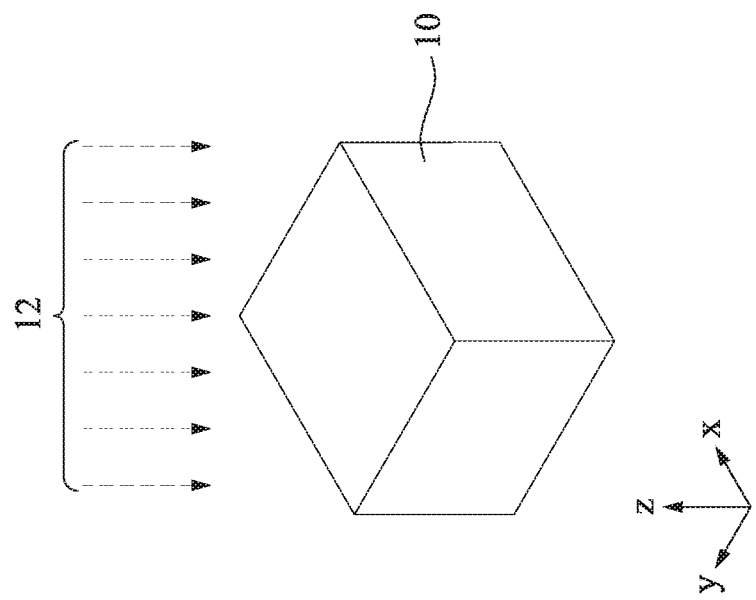
FIG. 1 shows a schematic view of a processing operation of a substrate, according to an embodiment of the present disclosure.

As shown in FIG. 1, impurity ions (dopants) 12 are implanted into a semiconductor substrate 10 to form a well region. The ion implantation is performed to prevent a punch-through effect. In one embodiment, substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si. The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer. In some embodiments of the present disclosure, the substrate 10 includes various regions that have been suitably doped with impurities (e.g., p-type or n-type conductivity). The dopants 12 are, for example, boron ($BF_2$) for an n-type FinFET and phosphorus for a p-type FinFET.

In FIG. 2, stacked semiconductor layers are formed over the substrate 10, in a case where a gate all-around (GAA) field effect transistor (FET) is fabricated. The stacked semiconductor layers include first semiconductor layers 20 and second semiconductor layers 21. The first semiconductor layers 20 and the second semiconductor layers 21 are formed of materials having different lattice constants, and include one or more layers of Si, Ge, SiGe, GaAs, InSb, GaP, GaSb, InAlAs, InGaAs, GaSbP, GaAsSb or InP, according to some embodiments of the present disclosure.

In some embodiments, the first semiconductor layers 20 and the second semiconductor layers 21 are formed of Si, a Si compound, SiGe, Ge or a Ge compound. In one embodiment, the first semiconductor layers 20 are $Si_{1-x}Ge_x$, where x is a value in a range of 0.1<x<1.0, or Ge (when x=1.0) and the second semiconductor layers 21 are Si or $Si_{1-y}Ge_y$, where y is less than x. In this disclosure, an "M compound" or an "M based compound" means the majority of the compound is M.

Also, in FIG. 2, five layers of the first semiconductor layer 20 and six layers of the second semiconductor layer 21 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 21 are epitaxially formed over the substrate 10. The thickness of the first semiconductor layers 20 may be equal to or greater than that of the second semiconductor layers 25, and is in a range from about 5 nm to about 50 nm in some embodiments, and is in a range from about 10 nm to about 30 nm in other embodiments. The thickness of the second semiconductor layers 21 is in a range from about 5 nm to about 30 nm in some embodiments, and is in a range from about 10 nm to about 20 nm in other embodiments. The thickness of each of the first semiconductor layers 20 may be the same, or may vary. In some embodiments, the bottom first semiconductor layer 20 (the closest layer 20 to the substrate 10) is thicker than the remaining first semiconductor layers 20. The thickness of the bottom first semiconductor layer 20 is in a range from about 10 nm to about 50 nm in some embodiments, or is in a range from about 20 nm to about 40 nm in other embodiments.

Further, in FIG. 2, a mask layer 30 is formed over the stacked layers 20 and 21. In some embodiments, the mask layer 30 includes a first mask layer 31 and a second mask layer 32. The first mask layer 31 is a pad oxide layer made of a silicon oxide, which can be formed by a thermal oxidation. The second mask layer 32 is made of a silicon nitride (Si—N), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 30 is patterned into a mask pattern by using patterning operations including photo-lithography and etching. In some embodiments, the first mask layer 31 is made of silicon nitride and the second mask layer 32 is made of silicon oxide.

Figure 3A:
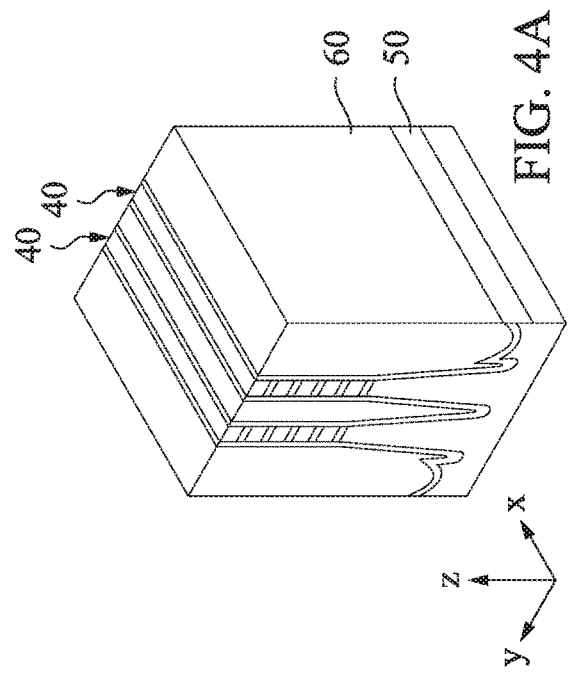
FIG. 3A shows a schematic view of fin structures made from the substrate and the stacked layers formed on the substrate of FIG. 2, according to an embodiment of the present disclosure.
Figure 3B:
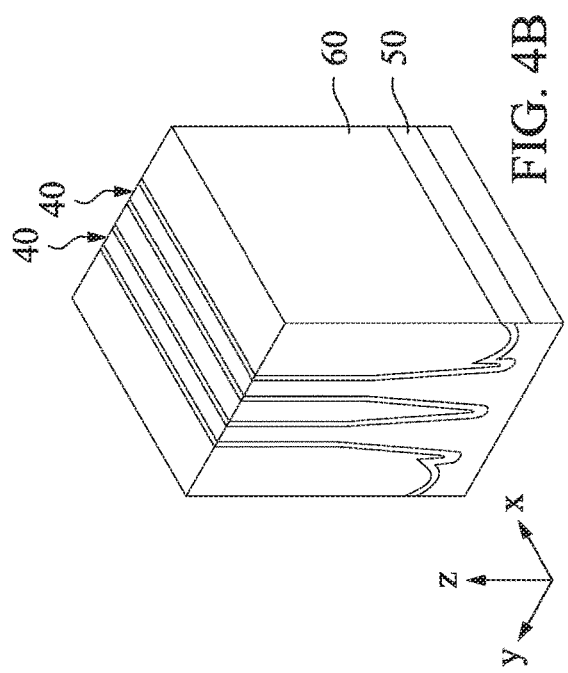
FIG. 3B shows a schematic view of fin structures, according to another embodiment of the present disclosure.
Figure 4A:
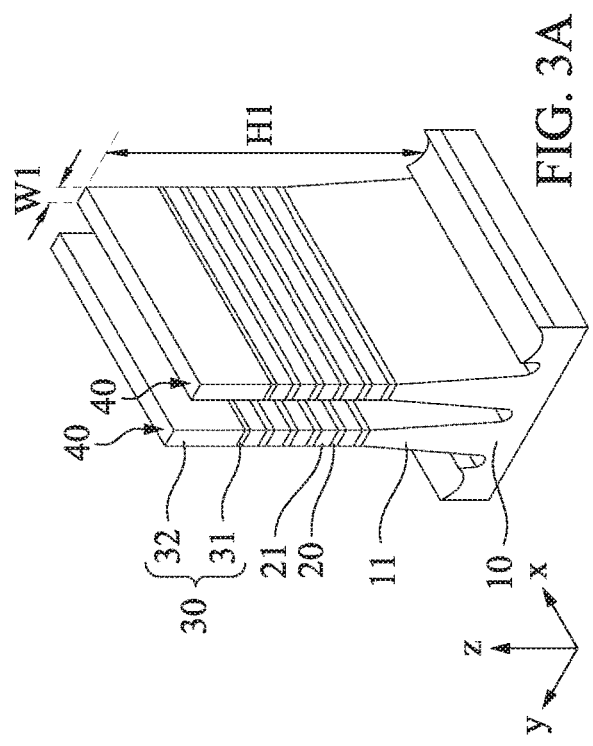
FIG. 4A shows a schematic view of the processed substrate of FIG. 3A, according to an embodiment of the present disclosure.
Figure 4B:
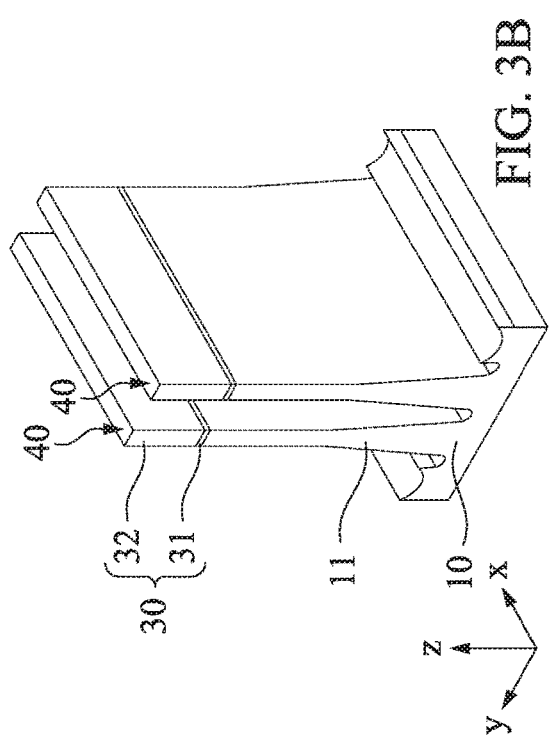
FIG. 4B shows a schematic view of the processed substrate of FIG. 3B, according to another embodiment of the present disclosure.

When the semiconductor device is a FinFET, no stacked layers are formed (see FIGS. 3B and 4B). In some embodiments, one or more epitaxial layers for a channel region are formed over the substrate 10. For GAA FET devices, operations shown in FIGS. 3A and 4A are applied. In FIG. 3A, the stacked layers of the first and second semiconductor layers 20, 21 are patterned by using the patterned mask layer 30, thereby the stacked layers 20 and 21 are formed into fin structures 40 extending in a lengthwise direction along the x direction. In some embodiments of the present disclosure, the fin structures 40 are formed by patterning using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. In some embodiments of the present disclosure, the photolithographic method includes ultraviolet (UV) photolithography, deep ultraviolet (DUV) photolithography, and extreme ultraviolet (EUV) photolithography.

In FIG. 3A, two fin structures 40 are arranged in the y direction but the number of the fin structures 40 is not limited to, and may be as small as one and three or more in some embodiments of the present disclosure. In some embodiments, one or more dummy fin structures are formed on both sides of the fin structures 40 to improve pattern fidelity in the patterning operations. As shown in FIG. 3A, the fin structures 40 have upper portions constituted by the stacked semiconductor layers 20, 21 and well portions 11. The width W1 of the upper portion of the fin structure 40 along the y direction is smaller than 10 nm in some embodiments, and in more advanced technological nodes, the width is 7 or 5 nm in other embodiments. The height H1 along the z direction of the fin structure 40 is equal to or greater than 100 nm.

FIG. 3B shows the case for a FinFET device. For a FinFET device, the substrate 10 (and/or an epitaxial layer formed over the substrate) is etched to form one or more fin structures. In FIG. 3B, the mask layer 30 including first mask layer 31 and second mask layer 32 formed on the substrate 10 is patterned by using the patterned mask layer 30, thereby the substrate 10 is formed into fin structures 40 extending in the lengthwise direction along the x direction. In FIG. 3B, two fin structures 40 are arranged in the y direction but the number of the fin structures 40 is not limited to two, and may be as small as one and three or more in some embodiments of the present disclosure, depending on the desired device performance and device architecture. In some embodiments, one or more dummy fin structures (not shown) are formed on both sides of the fin structures 40, i.e. between the two fin structures 40, to improve pattern fidelity in the patterning operations such as photolithographic patterning of the mask layer 30. As shown in FIG. 3B, the substrate 10 has well portions 11.

After the fin structures 40 are formed in FIG. 3A or FIG. 3B, an insulating material layer 60 including one or more layers of insulating material is formed over the substrate 10 in FIG. 4A or FIG. 4B so that the fin structures 40 are fully embedded in the insulating material layer 60. The insulating material for the insulating material layer 60 includes silicon oxide, silicon nitride, silicon oxynitride (Si—O—N), silicon carbon nitride (Si—C—N), silicon carbon oxynitride (Si—C—O—N), fluorine-doped silicate glass (FSG), or a low-k dielectric material, formed by LPCVD (low pressure chemical vapor deposition), plasma-CVD or flowable CVD. An anneal operation is performed after the formation of the insulating layer 60 in some embodiments of the present disclosure. Then, a planarization operation, such as a chemical mechanical polishing (CMP) method and/or an etch-back method, is performed such that the upper surface of the uppermost second semiconductor layer 21 or fin structure 40 is exposed from the insulating material layer 60 as shown in FIGS. 4A and 4B. In some embodiments, the first and second mask layers 31 and 32 are removed by the CMP as shown in FIGS. 4A and 4B, and in other embodiments, the CMP operation stops on the second mask layer 32. In some embodiments, a first liner layer or fin liner 50 is formed over the structure of FIGS. 3A and 3B before forming the insulating material layer 60, as shown FIG. 4A or FIG. 4B. The fin liner or first liner layer 50 is formed of silicon nitride Si—N or a silicon nitride-based material (e.g., silicon oxynitride Si—O—N, silicon carbon nitride Si—C—N, or silicon carbon oxynitride Si—C—O—N).

Figure 5A:
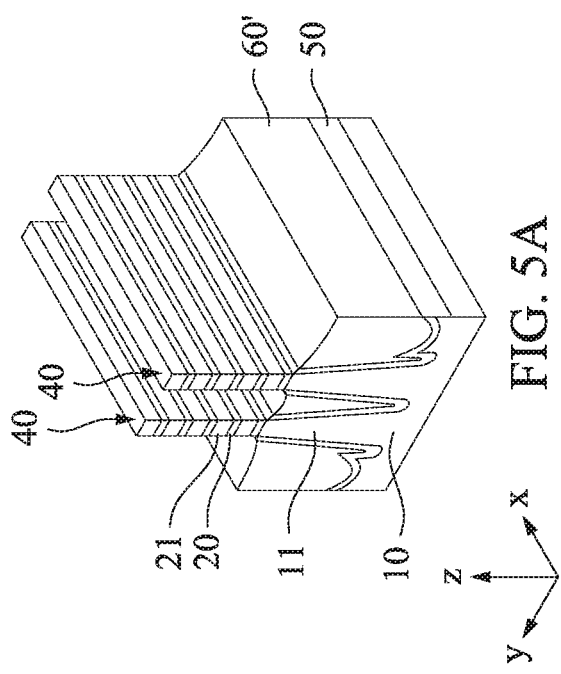
FIG. 5A shows a schematic view of the processed substrate of FIG. 4A, according to another embodiment of the present disclosure.
Figure 5B:
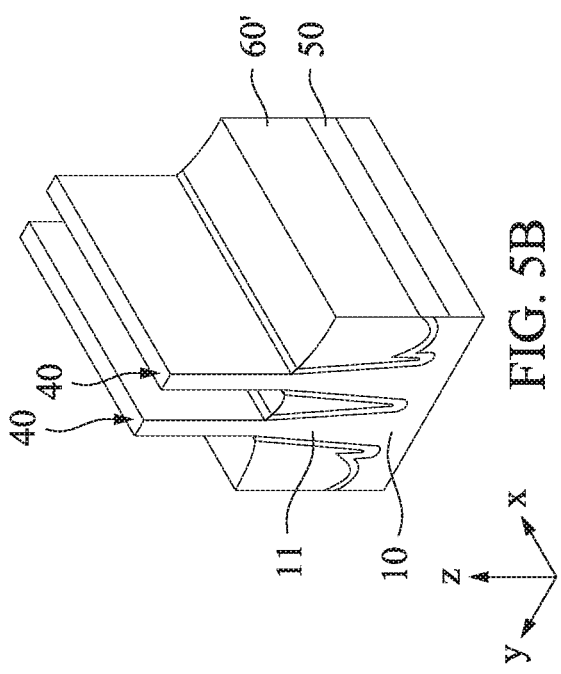
FIG. 5B shows a schematic view of the processed substrate of FIG. 4B, according to another embodiment of the present disclosure.

Then, as shown in FIG. 5A or FIG. 5B, the insulating material layer 60 is recessed to form an isolation insulating layer 60' so that the upper portions of the fin structures 40 are exposed. With this operation, the substrate 10 and the well portions 11 of the fin structures 40 are electrically separated from each other by the isolation insulating layer 60', which is also called a shallow trench isolation (STI) layer. In the embodiment shown in FIG. 5A, the insulating material layer 60 is recessed until the bottommost first semiconductor layer 20 is exposed. In other embodiments of the present disclosure, the upper portion of the well layer 11 is also partially exposed. The first semiconductor layers 20 are sacrificial layers which are subsequently partially removed, and the second semiconductor layers 21 are subsequently formed into channel layers of a GAA FET device.

Figure 6A:
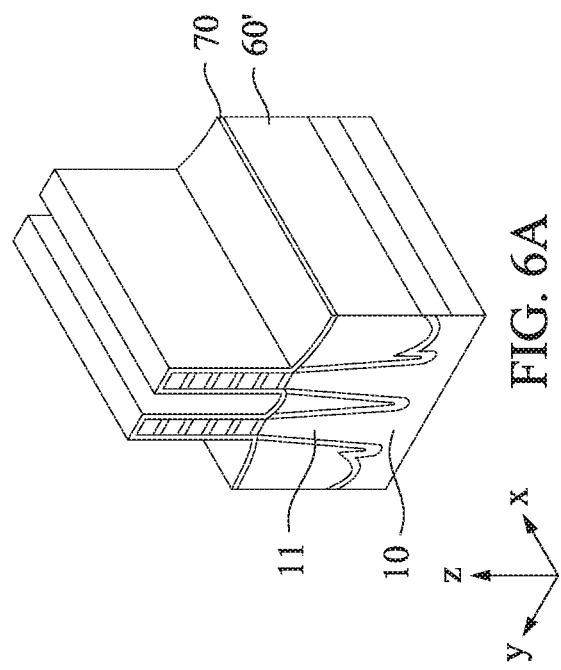
FIG. 6A shows a schematic view of the processed substrate of FIG. 5A, according to another embodiment of the present disclosure.
Figure 6B:
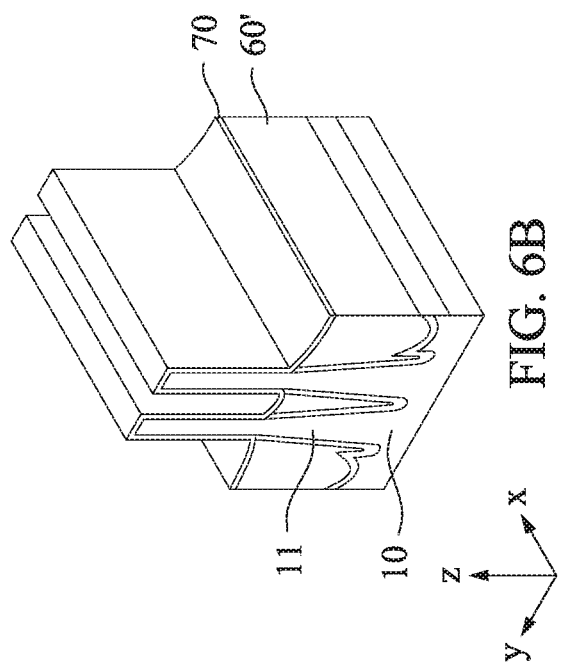
FIG. 6B shows a schematic view of the processed substrate of FIG. 5B, according to another embodiment of the present disclosure.

After the isolation insulating layer 60' is formed, a sacrificial gate dielectric layer 70 is formed, as shown in FIG. 6A or FIG. 6B. The sacrificial gate dielectric layer 70 includes one or more layers of insulating material, such as a silicon oxide-based material including $SiO_2$. In one embodiment, silicon oxide formed by chemical vapor deposition (CVD), including low pressure CVD (LPCVD) and plasma enhanced CVD (PECVD), physical vapor deposition (PVD), atomic layer deposition (ALD), or other suitable process is used. The thickness of the sacrificial gate dielectric layer 70 is in a range from about 1 nm to about 5 nm in some embodiments of the present disclosure. The sacrificial gate dielectric layer 70 is formed over the fin structure 40.

Figure 8:
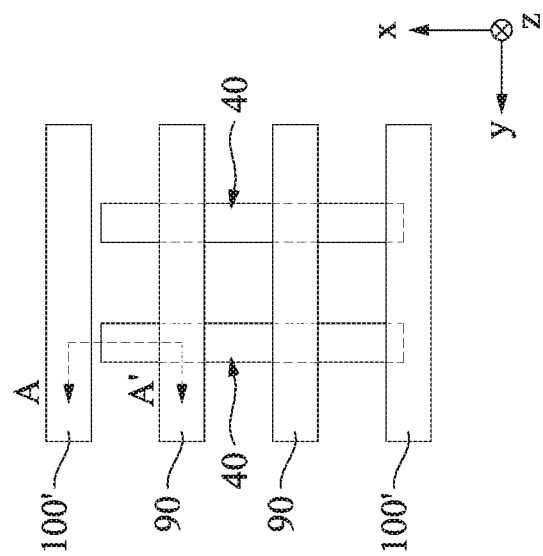
FIG. 8 shows a top plan view of the embodiment of FIG. 7.
Figure 7:
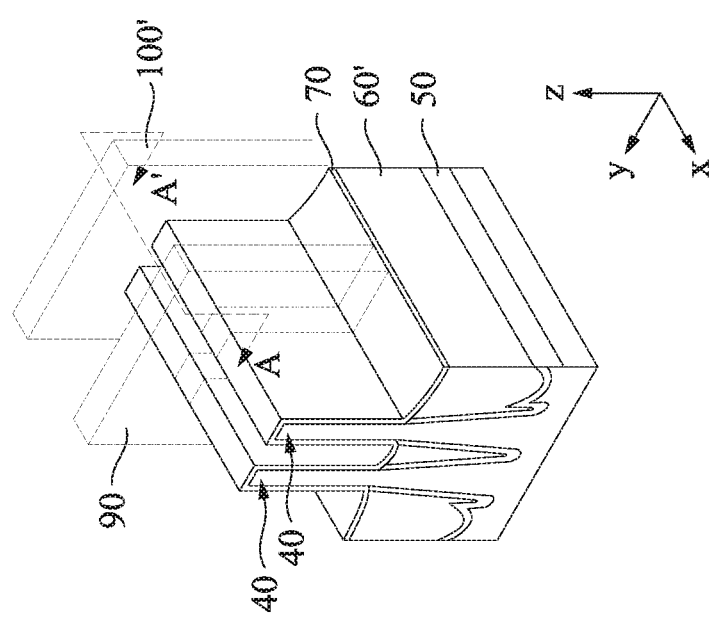
FIG. 7 shows a schematic view of an embodiment after processing the substrate of FIG. 6B.

Hereinafter, a manufacturing operation for a FinFET is explained. FIG. 7 shows a schematic view of the substrate of FIG. 6B with polycrystalline silicon dummy structures 90 and 100', according to an embodiment of the present disclosure and FIG. 8 shows a top plan view of the processed substrate of FIG. 7. In FIG. 7, in some embodiments of the present disclosure, the fin structures 40 are formed on the substrate 10 and extend in a lengthwise direction along x-direction. Each of the fin structures 40 has two fin edge regions at opposite ends along the lengthwise direction of the fin structures 40 along the x-direction. One or more channel regions are formed between the fin ends. In some embodiments of the present disclosure, the separation between the fin structures 40 depends on the device design, such as density of FinFET devices in a processor chip and the performance requirement of the semiconductor device having such a FinFET structure.

Also, in FIG. 7, the polycrystalline silicon dummy structures 100' are formed at a position adjacent to the fin ends of the fin structures 40 and are not formed over the fin structures 40. FIG. 8 shows a gap between the polycrystalline silicon dummy structure 100' and the fin structure 40. Also, polycrystalline silicon dummy structures 90 are formed over regions of the fin structures 40 between the fin edges or fin ends along the lengthwise direction in the x direction. The polycrystalline silicon dummy structures 90 are called 'dummy structures' and they will be removed and replaced with the gate structures of the FinFET devices, and the polycrystalline silicon dummy structures 100 are also 'dummy structures' because they will be subsequently removed. FIG. 8 shows a top plan view of the embodiment of FIG. 7. In FIG. 8, the polycrystalline silicon dummy structures 90 cover regions between the edges of fin ends of the fin structures 40 along a lengthwise direction of the fin structures 40. The polycrystalline silicon dummy structures 100' are not formed over the edges of ends of the fin structures 40. In some embodiments, the dummy structures 90 and 100' are formed of amorphous silicon or other suitable material.

FIGS. 9A, 9B, 10A, 10B, 11A, 11B, 12A, 12B, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 24A, 24A, 25A, and 25B show operations of manufacturing a semiconductor FinFET device according to an embodiment of the present disclosure. Each of the FIGS. 9A, 10A, 11A, 12A, 13A, 14A, 15A, 16A, 17A, 18A, 19A, 20A, 21A, 22A, 23A, 24A, and 25A includes a top plan view and each of the FIGS. 9B, 10B, 11B, 12B, 13B, 14B, 15B, 16B, 17B, 18B, 19B, 20B, 21B, 22B, 23B, 24B, and 25B includes a cross-sectional view of the semiconductor FinFET device along a cut line A-A in a plane including x and z axes of FIG. 7. FIGS. 9A and 9B show an operation for fin-end patterning. In particular, FIG. 9A shows a top plan view of an embodiment of the present disclosure. Also, FIG. 9B is a cross-sectional view of the embodiment, showing the layered structure. The fin structure 40 has a bottom region 40*i* and a top active region 40*a* which is processed to form a channel region (not shown) and a source/drain region (not shown).

As set forth above, after the fin structures are patterned by using the first and second mask layers 31 and 32 as shown in FIG. 5A or 5B, the insulating material layer 60 is formed to cover the patterned fin structures. Then, a CMP operation is performed to remove the upper portion of the insulating material layer 60' to form a STI layer 60'. In this embodiment, the CMP stops on the upper surface of the second mask layer 32. In FIG. 9B, a silicon nitride Si—N layer 80*a*, which corresponds to the first mask layer 31, is formed on the fin active region 40*a* and an insulating oxide layer 80*b*, which corresponds to the second mask layer 32, is formed on the Si—N layer 80*a*.

In FIG. 9B, a fin liner 50 is formed on the bottom region 40*i* of the fin structures 40. A mask pattern 80*c* is formed on the insulating oxide layer 80*b* by a photolithographic method. The mask pattern 80*c* is formed of a light sensitive photoresist material in some embodiments.

FIGS. 10A and 10B show an operation for etching the insulating oxide layer 80*b* and the shallow trench isolation (STI) layer 60'. The etching includes one or more dry etching and/or wet etching. FIG. 10A shows a top plan view and FIG. 10B shows a cross-sectional view. FIG. 10B shows that the shallow trench isolation (STI) layer 60' is recessed and the fin liner 50 is not etched. In some embodiments of the present disclosure, the STI layer 60' is recessed to have a top surface lower than the top surface of the fin liner 50. In some embodiments of the present disclosure, the STI layer 60' is recessed to have a top surface at the same level as the top surface of the fin liner 50.

FIGS. 11A and 11B show an operation for formation of sidewall spacer 140 for the fin end. The fin end sidewall spacer 140 for fin end is formed of a silicon nitride based insulating material, such as Si—N, Si—O—N, Si—C—N or Si—O—C—N, by a deposition method, such as chemical vapor deposition (CVD), including low pressure CVD (LPCVD) and plasma enhanced CVD (PECVD); physical vapor deposition (PVD); atomic layer deposition (ALD); or other suitable process. FIG. 11A shows a top plan view of the sidewall spacer 140 and FIG. 11B shows a cross-sectional view. As shown in FIG. 11B, the fin end sidewall spacer 140 is conformally formed. The thickness of the fin end sidewall spacer 140 is in a range from about 5 nm to about 50 nm in some embodiments, and is in a range from about 20 nm to about 40 nm in other embodiments. In other embodiments, the thickness can be smaller than 5 nm.

FIGS. 12A and 12B shows an operation for filling the embodiment of FIGS. 11A and 11B with a shallow trench isolation (STI) layer or STI-refill layer 60". After forming the STI-refill layer 60", an annealing process is performed in some embodiments. The formation of the STI-refill layer 60" is performed by methods such as chemical vapor deposition (CVD), including low pressure CVD (LPCVD) and plasma enhanced CVD (PECVD); and physical vapor deposition (PVD) such as sputtering; or other suitable process.

FIGS. 13A and 13B show an operation for chemical and mechanical polishing (CMP) process to remove the layers on the fin structure 40. FIG. 13A shows the top plan view after the CMP process, and FIG. 13B shows a cross-sectional view. By the CMP process, the upper surfaces of the fin structures 40*a* are exposed. In some embodiments of the present disclosure, e.g. FIG. 13B, after the CMP process, the top surface of the STI-refill layer 60" is at a level lower than the top surface of the fin-end sidewall spacer layer 140. In other embodiments of the present disclosure, as shown in FIG. 14B, the top surface of the STI-refill layer 60" is at substantially the same level as the top surface level of the fin end sidewall spacer layer 140 and/or the top surface of the fin structures 40a.

FIG. 15A shows a top plan view and FIG. 15B shows a cross-sectional view of an operation of manufacturing a semiconductor device according to an embodiment of the disclosure. A dummy oxide layer 200, similar to the sacrificial gate dielectric layer 70, is formed on the fin structures and the upper surface of the STI-refill layer 60″. In some embodiments, the oxide layer 200 is formed of insulating materials, such as silicon oxide by chemical vapor deposition (CVD), including low pressure CVD (LPCVD) and plasma enhanced CVD (PECVD); and physical vapor deposition (PVD), such as sputtering, or other suitable process.

FIG. 16A shows a top plan view and FIG. 16B shows a cross-sectional view of an embodiment having a polycrystalline silicon layer 90' formed over the dummy oxide layer 200. In some embodiments, the polycrystalline silicon layer 90' is formed using chemical vapor deposition (CVD), including low pressure CVD (LPCVD) and plasma enhanced CVD (PECVD); and physical vapor deposition (PVD), such as sputtering; or other suitable process.

FIG. 17A shows a top plan view and FIG. 17B shows a cross-sectional view of an embodiment having one or more hard mask layers formed on the polycrystalline silicon layer 90'. In some embodiments, the hard mask layer includes a first hard mask layer 90″ made of, for example, silicon nitride. The first hard mask layer 90″ is formed by using chemical vapor deposition (CVD), including low pressure CVD (LPCVD) and plasma enhanced CVD (PECVD); and physical vapor deposition (PVD), such as sputtering, atomic layer deposition (ALD) or other suitable process. In FIGS. 18A and 18B, a second hard mask layer 90‴ made of, for example, silicon oxide, is formed on the first hard mask layer 90″. The second hard mask layer 90‴ is formed by using chemical vapor deposition (CVD), including low pressure CVD (LPCVD) and plasma enhanced CVD (PECVD); and physical vapor deposition (PVD), such as sputtering; atomic layer deposition (ALD); or other suitable process. Then, as shown in FIGS. 19A and 19B, a mask pattern M is formed on the second hard mask layer 90‴ by spin coating and photolithographic method. The mask pattern M is formed of a light-sensitive photoresist layer. The region B outlined by the dotted line will be discussed in further details in FIGS. 20A-25B. FIGS. 20A and 20B show the enlarged region B of the embodiment of FIG. 19.

FIGS. 21A and 21B show an operation of etching the oxide hard mask layer 90‴, silicon nitride hard mask layer 90″, and the polycrystalline silicon layer 90' using the mask pattern M. The etching is anisotropic dry etching in some embodiments. Through this operation, the polycrystalline dummy silicon structures 90 and 100' are defined. The polycrystalline dummy silicon structure 90 is formed on a region in the fin structure 40, and the polycrystalline silicon dummy structure 100' is formed on a region spaced-apart from the fin end of the fin structure 40, e.g., between the ends of two adjacent fin structures. Because of overlay shifts in some embodiments, the patterned polycrystalline dummy silicon structure 100' is not formed at the edge of the fin end but is formed at a location spaced apart from the fin end. In certain embodiments, a gap g is formed between the polycrystalline dummy silicon structure 100' and the end of the fin 40. If the gap is wide, defects would not be formed because additional layers can be subsequently completely formed in the gap. On the other hand, if the gap g is narrow, additional layers may not be completely formed, as shown in FIGS. 22A to 25B.

FIGS. 22A and 22B show an operation according to some embodiments of the present disclosure. In this operation, a gate sidewall spacer layer 150 is conformally formed on the patterned polycrystalline silicon dummy structures of FIGS. 21A and 21B. After the gate sidewall spacer layer 150 is formed, anisotropic etching is performed to remove the gate sidewall spacer layer 150 formed on the top of the polycrystalline silicon dummy structures 90 and 100' and on the upper surface of the fin structure 40 (as shown in FIGS. 22A and 22B). The conformally formed gate sidewall spacer layer 150 does not fully cover the polycrystalline dummy silicon structure 100' because the conformal gate sidewall spacer layer 150 cannot be formed in the narrow gap g. The gate sidewall spacer layer 150 protects the source/drain epitaxial layer from being etched. Since the gate sidewall spacer layer 150 is not completely formed in the area of the narrow gap, a subsequently formed source/drain epitaxial layer may not be fully protected from a subsequent etch process. In other embodiments, the gate sidewall spacer layer 150 is at least partially or completely formed in the area of the narrow gap g.

FIGS. 23A and 23B show an operation according to an embodiment of the present disclosure. In FIGS. 23A and 23B, a source/drain space is formed in the fin active region 40a (not shown) by etching the fin active region 40a. The fin-end sidewall spacer 140 is not etched in the region between the polycrystalline silicon dummy structures 90 and the polycrystalline silicon dummy structures 100' during etching of the fin active region 40a. Thus, the etched portion of the active region 40a is laterally separated from the polycrystalline silicon layer 90 of the polycrystalline silicon dummy structures 100' (not shown).

FIGS. 24A and 24B show an operation according to an embodiment of the present disclosure. In FIGS. 24A and 24B, source/drain epitaxial layer 120 is deposited in the source/drain space formed in the fin active region 40a. In some embodiments, the source/drain epitaxial layer includes Si—P, SiGe, etc. The source/drain epitaxial layer 120 is separated from the polycrystalline silicon dummy structures 90 and 100' by the fin end sidewall spacer layer 140 and/or the gate sidewall spacers 150 of the polycrystalline silicon dummy structures 100'.

FIGS. 25A and 25B show an operation of depositing an insulating dielectric layer 130 on the source/drain epitaxial layer 120 and removing the polycrystalline silicon dummy structures 90 and 100' without removing the sidewall spacers 150. During the process of removing the polycrystalline silicon dummy structures 90 and 100', the source/drain epitaxial layer 120 is covered by the fin-end sidewall spacer layer 140 and the insulting dielectric layer and is thus not etched or removed, preserving the source/drain epitaxial layer 120 at fin end of the fin structure 40. In this way, the source/drain epitaxial layer 120 is not etched even if the gate sidewall spacer layer 150 which is supposed to protect the source/drain epitaxial layer 120 from etching is not fully formed.

Figure 27:
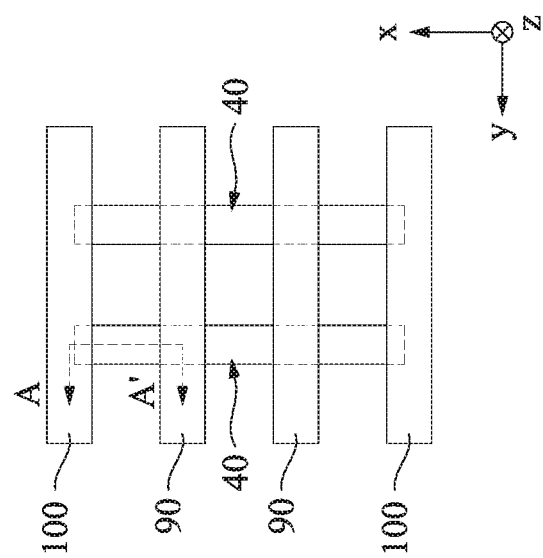
FIG. 27 shows a top plan view of the embodiment of FIG. 26.
Figure 26:
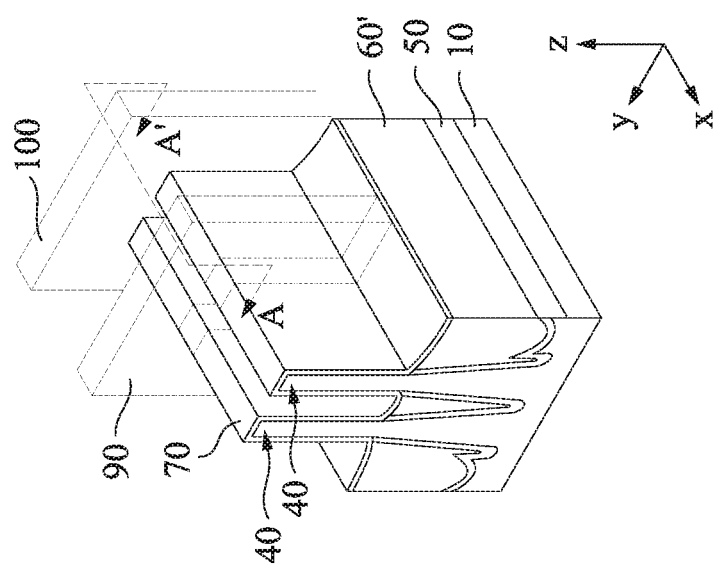
FIG. 26 shows a schematic view of another embodiment after processing the substrate of FIG. 6B.

Hereinafter, a manufacturing operation for a FinFET according to another embodiment is explained. FIG. 26 shows a schematic view of the substrate of FIG. 6B with polycrystalline silicon dummy structures 90 and 100, according to an embodiment of the present disclosure and FIG. 27 shows a top plan view of the processed substrate of FIG. 26. In FIG. 26, in some embodiments of the present disclosure, the fin structures 40 are formed on the substrate 10 and extend in a lengthwise direction along x-direction. Each of the fin structures 40 has two fin edge regions at opposite ends along the lengthwise direction of the fin structures 40 in the x-direction. One or more channel regions are formed between the fin ends. In some embodiments of the present disclosure, the separation between the fin structures 40 depends on the device design.

Also, in FIG. 26, the polycrystalline silicon dummy structure 100 is formed over the fin ends of the fin structures 40. As shown in FIG. 27, there are no gaps between the polycrystalline silicon dummy structure 100 and the fin structure 40, and the polycrystalline silicon dummy structure 100 overlaps the ends of the fin structure 40. The polycrystalline silicon dummy structures 90 are formed over regions of the fin structures 40 between the fin ends along the lengthwise direction. FIG. 27 shows a top plan view of the embodiment of FIG. 26. In some embodiments, the dummy structures 90 and 100' are formed of amorphous silicon or other suitable material.

FIGS. 28A, 28B, 29A, 29B, 30A, 30B, 31A, 31B, 32A, 32B, 33A, 33B, 34A, 34B, 35A, 35B, 36A, 36B, 37A, 37B, 38A, 38B, 39A, 39B, 40A, 40B, 41A, 41B, 42A, 42B, 43A, 43B, 44A, and 44B show operations of manufacturing a semiconductor FinFET device according to an embodiment of the present disclosure. Each of the FIGS. 28A, 29A, 30A, 31A, 32A, 33A, 34A, 35A, 36A, 37A, 38A, 39A, 40A, 41A, 42A, 43A, and 44A includes a top plan view and each of the FIGS. 28B, 29B, 30B, 31B, 32B, 33B, 34B, 35B, 36B, 37B, 38B, 39B, 40B, 41B, 42B, 43B, and 44B includes a cross-sectional view of the semiconductor FinFET device along a cut line A-A in a plane including x and z axes of FIG. 1. FIGS. 28A and 28B show an operation for fin-end patterning. In particular, FIG. 28A shows a top plan view of an embodiment of the present disclosure. Also, FIG. 28B shows a cross-sectional view of the embodiment, indicating the layering structure. The fin structure 40 has a bottom region 40i and a top active region 40a which is processed to form a channel region (not shown) and a source/drain region (not shown). As set forth above, after the fin structures 40 are patterned by using the first and second mask layers 31 and 32 as shown in FIG. 5A or 5B, the insulating material layer 60' is formed to cover the patterned fin structures 40. Then, a CMP operation is performed to remove the upper portion of the insulating material layer 60' to form an STI layer 60'. In this embodiment, the CMP stops on the upper surface of the second mask layer 32. In FIGS. 28A and 28B, a silicon nitride Si—N layer 80a, which corresponds to the first mask layer 31, is formed on the fin active region 40a, and an insulating oxide layer 80b, which corresponds to the second mask layer 32, is formed on the Si—N layer 80a.

In FIG. 28B, a fin liner 50 is formed on the bottom region 40i of the fin structures 40. A mask pattern 80c is subsequently formed on the insulating oxide layer 80b by a photolithographic method. The mask pattern 80c is formed of a light sensitive photoresist material in some embodiments.

FIGS. 29A and 29B show an operation for etching the insulating oxide layer 80b and the shallow trench isolation (STI) layer 60'. The etching includes one or more dry etching and/or wet etching. FIG. 29A shows a top plan view, and FIG. 29B shows a cross-sectional view of the embodiment. FIG. 29B shows that the shallow trench isolation (STI) layer 60' is recessed and the fin liner 50 is not etched. In some embodiments of the present disclosure, the STI layer 60' is recessed to have a top surface lower than the top surface of the fin liner 50. In some embodiments of the present disclosure, the STI layer 60' is recessed to have a top surface at the same level as the top surface of the fin liner 50.

FIGS. 30A and 30B show an operation for formation of sidewall spacer 140 for fin end. The fin end sidewall spacer 140 for fin end is formed of a silicon nitride based insulating material, such as Si—N, Si—O—N, Si—C—N or Si—O—C—N, by a deposition method, such as chemical vapor deposition (CVD), including low pressure CVD (LPCVD) and plasma enhanced CVD (PECVD); physical vapor deposition (PVD); atomic layer deposition (ALD); or other suitable process. As shown in FIGS. 30A and 30B, the fin-end sidewall spacer 140 is conformally formed. The thickness of the fin-end sidewall spacer 140 is in a range from about 5 nm to about 50 nm in some embodiments, and is in a range from about 20 nm to about 40 nm in other embodiments. In other embodiments, the thickness can be smaller than 5 nm.

Figure 31A:
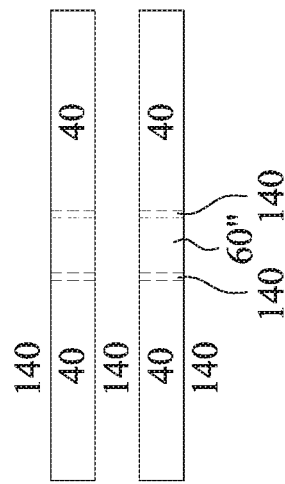
Figure 31B:
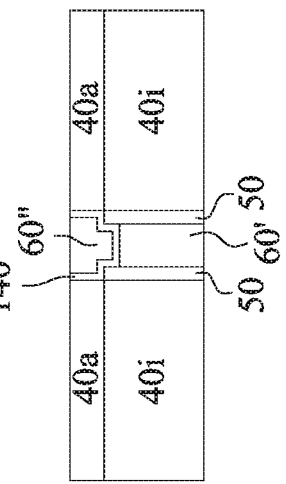

FIGS. 31A and 31B show an operation for filling the embodiment of FIGS. 30A and 30B with a shallow trench isolation (STI) layer or STI-refill layer 60". After forming this STI-refill layer 60", an annealing process is performed in some embodiments. The formation of the STI-refill layer 60" is performed by methods such as chemical vapor deposition (CVD), including low pressure CVD (LPCVD) and plasma enhanced CVD (PECVD); and physical vapor deposition (PVD) such as sputtering; or other suitable process.

Figure 32A:
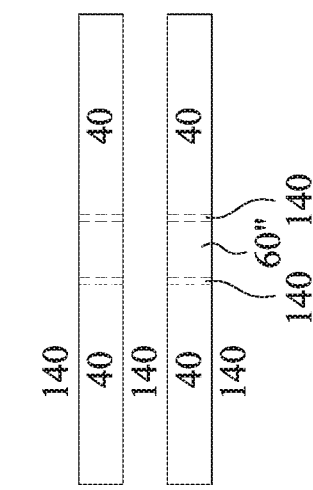
Figure 33A:
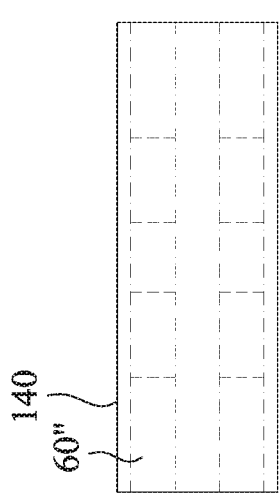
Figure 32B:
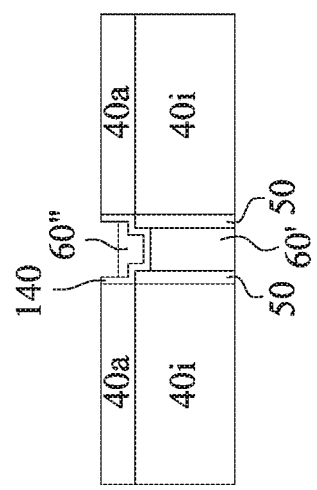
Figure 33B:
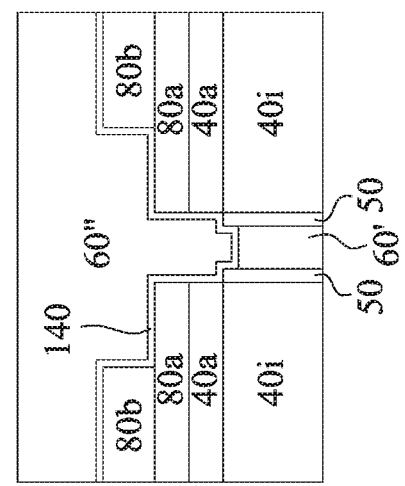

FIGS. 32A and 32B show an operation for chemical and mechanical polishing (CMP) process to remove the layers over the fin structure 40. FIG. 32A shows the top plan view of the embodiment after the CMP process, and FIG. 32S shows a cross-sectional view of the embodiment. By the CMP process, the upper surfaces of the fin structures 40 are exposed. In some embodiments of the present disclosure, e.g. FIG. 32B, after the CMP process, the top surface of the STI-refill layer 60" is at a level lower than the top surface of the fin-end sidewall spacer layer 140. In other embodiments of the present disclosure, as shown in FIG. 33B, the top surface of the STI-refill layer 60" is at substantially the same level as the top surface level of the fin-end sidewall spacer layer 140 and/or the top surface of the fin structures 40.

Figure 34A:
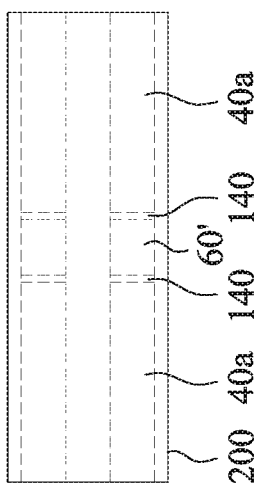
Figure 34B:
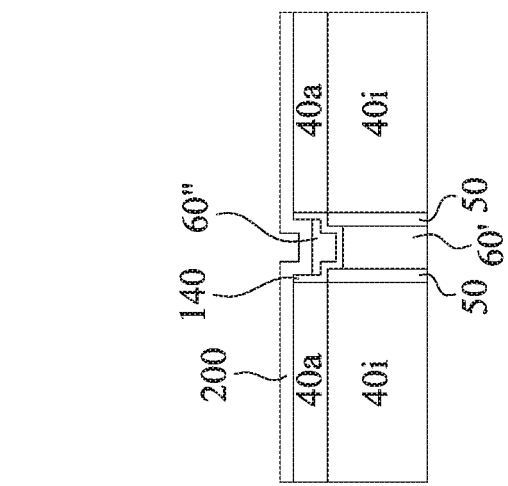

A dummy oxide layer 200, similar to the sacrificial gate dielectric layer 70, is formed on the fin structures and the upper surface of the STI-refill layer 60" as shown in FIGS. 34A and 34B. In some embodiments, the dummy oxide layer 200 is formed of insulating materials such as silicon oxide by chemical vapor deposition (CVD), including low pressure CVD (LPCVD) and plasma enhanced CVD (PECVD); and physical vapor deposition (PVD) such as sputtering; or other suitable process.

Figure 35A:
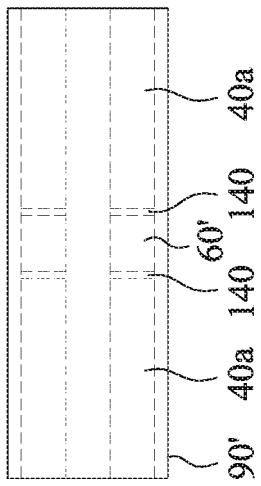
Figure 35B:
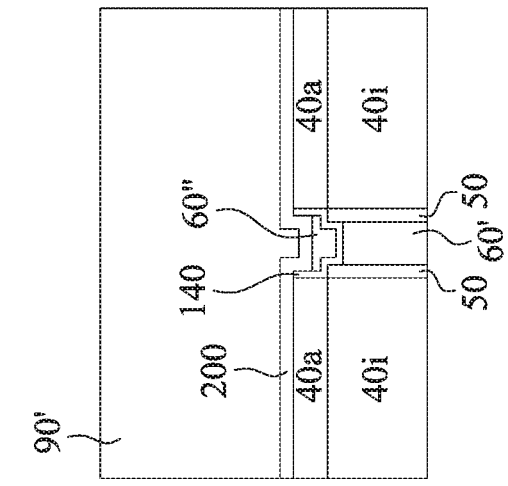

In FIGS. 35A and 35B, a polycrystalline silicon layer 90' is formed over the dummy oxide layer 200. In some embodiments, the polycrystalline silicon layer 90' is formed using chemical vapor deposition (CVD), including low pressure CVD (LPCVD) and plasma enhanced CVD (PECVD); and physical vapor deposition (PVD) such as sputtering; or other suitable process.

Figure 36A:
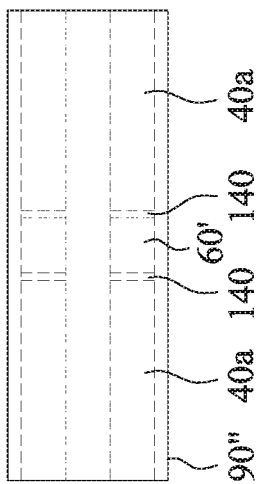
Figure 36B:
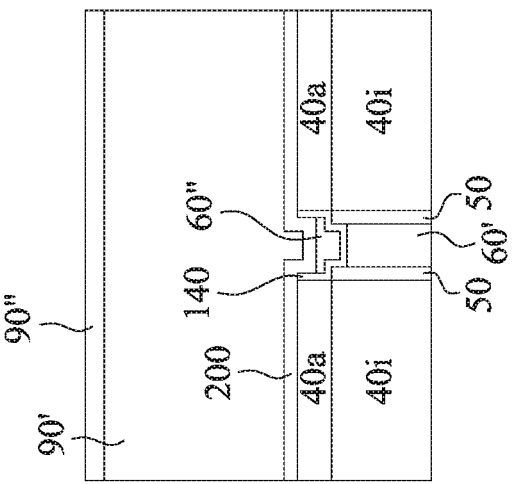
Figure 37A:
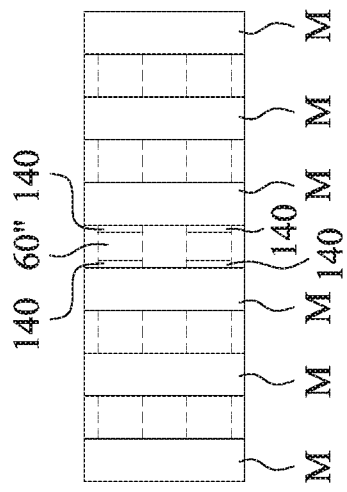
Figure 37B:
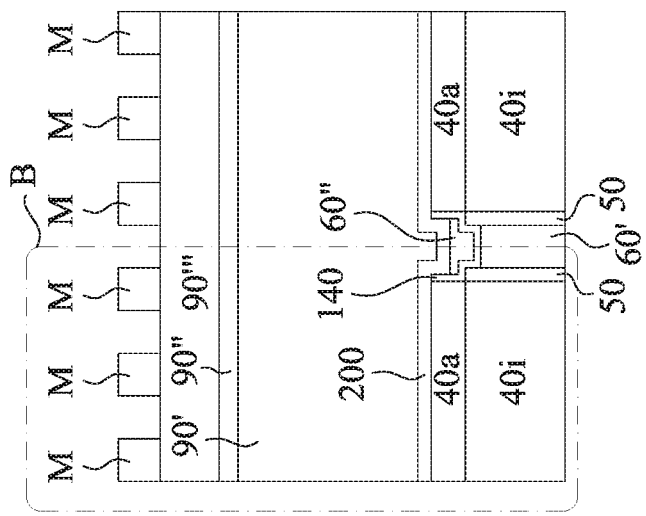
Figure 38A:
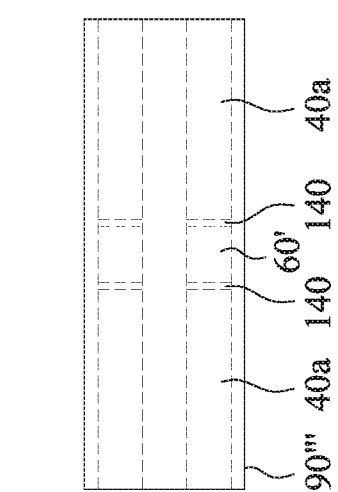
Figure 38B:
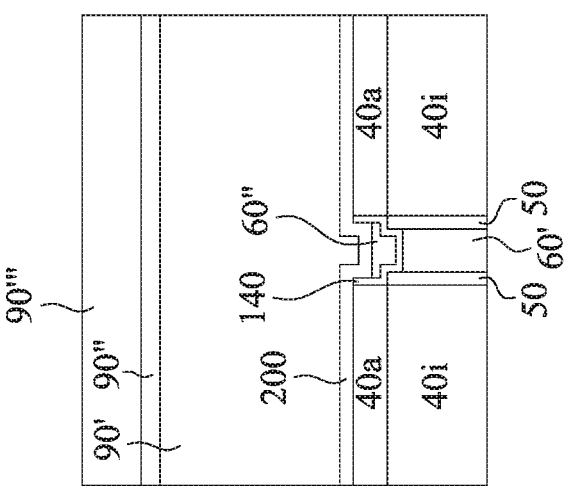

One or more hard mask layers is formed on the polycrystalline silicon layer 90' as shown in FIGS. 36A and 36B. In some embodiments, the hard mask layer includes a first hard mask layer 90" made of, for example, silicon nitride. The hard mask layer 90" is formed by using chemical vapor deposition (CVD), including low pressure CVD (LPCVD) and plasma enhanced CVD (PECVD); and physical vapor deposition (PVD) such as sputtering; atomic layer deposition (ALD) or other suitable process. In FIGS. 37A and 37B, a second hard mask layer 90''' made of, for example, silicon oxide, is formed on the first hard mask layer 90". The second hard mask layer 90''' is formed by using chemical vapor deposition (CVD), including low pressure CVD (LPCVD) and plasma enhanced CVD (PECVD), and physical vapor deposition (PVD) such as sputtering, atomic layer deposition (ALD) or other suitable process. Then, as shown in FIGS. 38A and 38B, a mask pattern M is formed on the second hard mask layer 90''' by spin coating and a photolithographic method. The mask pattern M is formed of a light-sensitive photoresist layer in some embodiments. The region B outlined by the dotted line will be discussed in further details in FIGS. 39A-44B. FIGS. 39A and 39B show the enlarged region B of the embodiment of FIG. 38B.

FIGS. 40A and 40B show an operation of etching the oxide hard mask layer 90''', silicon nitride hard mask layer 90'', and the polycrystalline silicon layer 90' using the mask pattern M. The etching is anisotropic dry etching in some embodiments. Through this operation, the polycrystalline dummy silicon structures 90 and 100 are defined. The polycrystalline silicon dummy structures 90 are formed on a region in the fin structure 40, and the polycrystalline silicon dummy structures 100 are formed on an edge of the fin end of the fin structure 40.

FIGS. 41A and 41B show an operation according to some embodiments of the present disclosure. In this operation, a gate sidewall spacer layer 150 is conformally formed on the patterned polycrystalline silicon dummy structures of FIGS. 40A and 40B. After the gate sidewall spacer layer 150 is formed, anisotropic etching is performed to remove the gate sidewall spacer layer 150 formed on the top of the polycrystalline silicon dummy structures 90 and 100 and on the upper surface of the fin structure 40.

FIGS. 42A and 42B show an operation according to an embodiment of the present disclosure. In FIGS. 42A and 42B, a source/drain space is formed in the fin active region 40*a* by etching the fin active region 40*a*. In the etching of the fin active region 40*a*, at the region between the polycrystalline silicon dummy structures 90 and the polycrystalline silicon dummy structures 100, the fin-end sidewall spacer 140 and/or the gate sidewall spacer 150 on the polycrystalline silicon dummy structures 100 is not etched, and thus the etched portion of the active region 40*a* is laterally separated from the polycrystalline silicon layer 90 of the polycrystalline silicon dummy structures 100.

FIGS. 43A and 43B show an operation according to an embodiment of the present disclosure. In FIGS. 43A and 43B, a source/drain epitaxial layer 120 including Si—P is deposited in the source/drain space formed in the fin active region 40*a*. The source/drain epitaxial layer 120 is separated from the polycrystalline silicon dummy structures 90 and 100 by the sidewall spacer layer 140.

FIGS. 44A and 44B show an operation of depositing an insulating dielectric layer 130 on the source/drain epitaxial layer 120 and removing the polycrystalline silicon dummy structures 90 and 100' without removing the sidewall spacers 150. Because fin-end sidewall spacer 140 covers the edge of the fin structure, the source/drain epitaxial layer 120 is not etched or removed. The fin end spacer layer 140 provides protection, preserving the source/drain epitaxial layer 120 at the end of the fin structure 40 while achieving the desired overlay shift for tuning device performance without requiring a new mask.

In the above embodiments, the positions of the polycrystalline silicon dummy structures 100 (FIGS. 26A-44B) and 100' (FIGS. 7A-25B) are different. Because of the structure of sidewall spacer layer 140 fully covering or enclosing the polycrystalline silicon dummy structures 90, 100, and 100' and the fin 40, the source/drain epitaxial layers 120 can still be maintained intact without being etched or chemically altered through subsequent semiconductor processing.

Overlay shift causes misalignment of structures and the formation of a desirable narrow gap g, which does not allow the protective layers of a device to be fully formed, thereby, causing defects in device. In the foregoing embodiments, a fin-end sidewall spacer 140 is employed to protect the source/drain epitaxial layer and fin ends during dummy polycrystalline silicon removal.

FIGS. 45-48 show operations of manufacturing a semiconductor FET having a polycrystalline silicon dummy structure 100 formed on an edge of a fin structure 40, while FIGS. 49-52 show operations of manufacturing a semiconductor FET having a polycrystalline silicon dummy structure 100' spaced-apart from an edge of a fin structure 40.

FIGS. 45-48 show cross-sectional views of various stages of manufacturing a semiconductor device. In FIG. 45, a fin liner 50 is formed on the substrate 10 and on the fin structures 40. In some embodiments of the present disclosure, the fin liner 50 is an insulating layer that includes one of silicon nitride, silicon oxide, silicon oxynitride, silicon oxycarbide, silicon carbon nitride, and silicon carbon oxynitride, or any other suitable dielectric material. In some embodiments of the present disclosure, the fin liner 50 is formed using chemical vapor deposition (CVD), including low pressure CVD (LPCVD) and plasma enhanced CVD (PECVD); physical vapor deposition (PVD); atomic layer deposition (ALD); or other suitable process.

An isolation insulating layer 60' is formed on the substrate 10 over the fin liner 50. In some embodiments, the isolation insulating layer 60' is formed to fill the space between the adjacent fin structures 40 and between the adjacent fin liners 50. The isolation insulating layer 60' is also called a shallow trench isolation (STI). In some embodiments, the STI 60' is formed by chemical vapor deposition (CVD), flowable CVD (FCVD), or a spin-on-glass process, although any acceptable process may be utilized. After forming the isolation insulating layer 60', an etching operation such as an isotropic etch is performed to reduce the thickness of the isolation insulating layer 60' along the thickness direction of the substrate 10. In some embodiments of the present disclosure, the height of the fin liner 50 along the z axis is also reduced to the same level as the isolation insulation layer 60'. A fin end spacer layer 140 is conformally formed using chemical vapor deposition (CVD), including low pressure CVD (LPCVD) and plasma enhanced CVD (PECVD); physical vapor deposition (PVD); atomic layer deposition (ALD); or other suitable process. In some embodiments, the fin end spacer layer 140 is formed of the aforementioned materials for forming this layer.

FIG. 45 further shows that a dummy oxide layer 200 is formed on the substrate 10 covering the fin structure 40, the fin liner 50, and the isolation insulating layer 60'. The dummy oxide layer 200 is subsequently removed or partially removed. In some embodiments of the present disclosure, the dummy oxide layer 200 includes an insulating oxide layer. In some embodiments of the present disclosure, the dummy oxide layer 200 and the fin liner 50 are formed of the same material. In some embodiments of the present disclosure, the dummy oxide layer 200 and the fin liner 50 are formed of different materials.

Polycrystalline silicon dummy structures 90 and 100 are formed at a region between the ends of the fin structure 40 and an edge region of the fin structure 40, respectively, by deposition and patterning using a method including one or more of the aforementioned photolithographic methods. Because of overlay shift (OS) the polycrystalline silicon dummy structures 90 and 100 are moved in the direction indicated by the white block arrows to new locations such that the polycrystalline silicon dummy structure 100 is not formed on the edge of the fin end and is formed at a location spaced-apart from the fin end as shown in FIG. 45. The overlay shift OS causes the formation of an undesirable narrow gap g between the fin 40 and the polycrystalline silicon dummy structure 100.

FIG. 46 shows the gate sidewall spacer layer 150 formed on the polycrystalline silicon dummy structures 90 and 100. In some embodiments of the present disclosure, the gate sidewall spacers 150 are formed using chemical vapor deposition (CVD), including low pressure CVD (LPCVD) and plasma enhanced CVD (PECVD); physical vapor deposition (PVD); atomic layer deposition (ALD); or other suitable process. FIG. 46 shows the gate sidewall spacer layer 150 is not fully formed into the narrow gap g.

FIG. 47 shows an operation of forming a source/drain region by partially removing the insulating layer 200 and a portion of the active region of the active fin region 40a. In some embodiments of the present disclosure, the source/drain region has a substantially triangle, trapezoid, pentagon, or hexagon shape depending on parameters of the etch process used to form the source/drain region and/or a crystal structure of the substrate 10. During the formation of the source/drain region, the sidewall spacers 150 formed on the lateral sides of the polycrystalline silicon dummy structures 90 and 100 are not removed. In some embodiments, the source/drain space is formed in a top region of the fin structure 40 between the gate sidewall spacers 150. In some embodiments of the present disclosure, the source/drain space is formed by isotropic etching or anisotropic etching, depending on the desired shape and size of the source/drain space in the fin structure 40. The sidewall spacer layer 150 is formed of the same material and method as the aforementioned embodiments of the present disclosure.

In the operation shown in FIG. 47, a source/drain region of the fin structure 40 is etched down to form a recess, and a source/drain epitaxial layer 120 is formed in the source/drain recess. The source/drain epitaxial layer 120 is formed by deposition methods such as chemical vapor deposition (CVD), including low pressure CVD (LPCVD) and plasma enhanced CVD (PECVD); physical vapor deposition (PVD); molecular beam epitaxy (MBE); atomic layer deposition (ALD); or other suitable process. In some embodiments of the present disclosure, the source/drain epitaxial layer 120 includes Si—P. In some embodiments of the present disclosure, the source/drain epitaxial layer 120 includes one or more layers of Si, Si:P (P doped Si), SiC or SiC:P (P doped SiC). In other embodiments, the source/drain epitaxial layer 120 includes one or more layers of SiGe doped with or without boron.

In the operation shown in FIG. 48, an insulating dielectric layer 130 is formed in the space between the gate sidewall spacer layers 150. In some embodiments, before forming the insulating dielectric layer 130, an insulating layer (not shown) is conformally formed on the surfaces of the gate sidewall spacer layers 150. In some embodiments, the insulating dielectric layer 130 is formed of a dielectric material such as a high-k dielectric material. The polycrystalline silicon dummy structures 90 and 100 are removed by etching while the gate sidewall spacers 150 remain not etched. In some embodiments of the present disclosure, wet etching using tetramethylammonium hydroxide (TMAH) is employed to remove the polycrystalline silicon dummy structures 90 and 100.

FIGS. 49, 50, 51, and 52 show cross-sectional views of another embodiment of the present disclosure. In FIG. 49, a fin liner 50 is formed on the substrate 10, and on the fin structures 40. In some embodiments of the present disclosure, the fin liner 50 is an insulating layer that includes one of silicon nitride, silicon oxide, silicon oxynitride, silicon oxycarbide, silicon carbon nitride, and silicon carbon oxynitride, or any other suitable dielectric material. In some embodiments of the present disclosure, the fin liner 50 is formed using chemical vapor deposition (CVD), including low pressure CVD (LPCVD) and plasma enhanced CVD (PECVD); physical vapor deposition (PVD); atomic layer deposition (ALD); or other suitable process.

Also, in an operation shown in FIG. 49, an isolation insulating layer 60' is formed on the substrate 10 adjacent to the fin liner 50. In some embodiments, the isolation insulating layer 60' fills the space between the adjacent fin structures 40 and between the adjacent fin liners 50. The isolation insulating layer 60' is also called shallow trench isolation (STI). In some embodiments, the STI 60' is formed by chemical vapor deposition (CVD), flowable CVD (FCVD), or a spin-on-glass process, although any acceptable process may be utilized. After forming the isolation insulating layer 60', an etching operation such as an isotropic etch is performed to reduce the thickness of the isolation insulating layer 60' along the thickness direction of the substrate 10. In some embodiments of the present disclosure, the height of the fin liner 50 along the z axis is also reduced to the same level as the isolation insulation layer 60'. In FIG. 49, a fin end spacer layer 140 is formed by the aforementioned method and is formed of the materials of the above mentioned layer 140.

In FIG. 49, a dummy oxide layer 200 is also formed on the substrate 10 covering the fin structure 40, the fin liner 50, and the isolation insulating layer 60'. The dummy oxide layer 200 is subsequently removed or partially removed. In some embodiments of the present disclosure, the dummy oxide layer 200 includes an insulating oxide layer. In some embodiments of the present disclosure, the dummy oxide layer 200 and the fin liner 50 are formed of the same material. In some embodiments of the present disclosure, the dummy oxide layer 200 and the fin liner 50 are formed of different materials.

Also, in the operation shown in FIG. 49, the polycrystalline silicon dummy structures 90 and 100' are formed at a region in the fin structure 40 and a region spaced-apart from an edge region at a fin end of the fin structure 40, respectively, by deposition and patterning using a method including one or more of the aforementioned photolithographic methods. In some embodiments, a gate replacement technology is used, and in such a case, the polycrystalline silicon dummy structure 90 is subsequently replaced with metal material to form a gate electrode of the FinFET device. In some embodiments, the polycrystalline silicon dummy structure 100' is not for a device structure and is also 'dummy poly' because it is merely formed to protect the edge of the fin end from being etched during etching operations of the manufacturing method of the semiconductor device including the fin structure 40. The 'dummy poly' 100' for forming a contact structure is not formed to have the same function as the polycrystalline silicon layer 90 for forming a gate electrode. FIG. 49 shows that overlay shift OS moves the polycrystalline silicon layer 90 and 'dummy poly' 100' in a direction shown by the block arrows to new locations, forming a narrow gap g.

FIG. 50 shows an operation where gate sidewall spacers 150 are formed on the polycrystalline silicon dummy structures 90 and 100'. In some embodiments of the present disclosure, the gate sidewall spacers 150 are formed using chemical vapor deposition (CVD), including low pressure CVD (LPCVD) and plasma enhanced CVD (PECVD); physical vapor deposition (PVD); atomic layer deposition (ALD); or other suitable process. FIG. 50 shows that the gate sidewall spacer layer 150 is not completely formed in the narrow gap g and its function cannot be fully carried out.

The insulating layer 200 and a portion of the active region of the active fin region 40a are subsequently partially removed in a source/drain region. In some embodiments of the present disclosure, the source/drain region has a substantially triangle, trapezoid, pentagon, or hexagon shape depending on parameters of the etch process used to form the source/drain region and/or a crystal structure of the substrate 10. During the formation of the source/drain region, the sidewall spacers 150 formed on the polycrystalline silicon dummy structures 90 and 100' are not removed. In some embodiments, the source/drain space is formed in a top region of the fin structure 40 between the gate sidewall spacers 150. In some embodiments of the present disclosure, the source/drain space S/D is formed by isotropic etching or anisotropic etching, depending on the desired shape and size of the source/drain space S/D in the fin structure 40. The gate sidewall spacer layer 150 is formed of the same material and method as the aforementioned embodiments of the present disclosure.

In the operation shown in FIG. 51, a source/drain epitaxial layer 120 is formed in the source/drain recess. The source/drain epitaxial layer 120 is formed by deposition methods such as chemical vapor deposition (CVD), including low pressure CVD (LPCVD) and plasma enhanced CVD (PECVD), physical vapor deposition (PVD), molecular beam epitaxy (MBE), atomic layer deposition (ALD), or other suitable process. In some embodiments of the present disclosure, the source/drain epitaxial layer 120 includes Si—P. In some embodiments of the present disclosure, the source/drain epitaxial layer 120 includes one or more layers of Si, Si:P (P doped Si), SiC or SiC:P (P doped SiC). In other embodiments, the source/drain epitaxial layer 120 includes one or more layers of SiGe doped with or without boron.

In the operation shown in FIG. 52, an insulating dielectric layer 130 is formed in the space between the gate sidewall spacers 150 for forming a contact structure. In some embodiments, before forming the insulating dielectric layer 130, an insulating layer (not shown) is conformally formed on the surfaces of the gate sidewall spacers 150. In some embodiments, the insulating dielectric layer 130 is formed of a dielectric material such as a high-k dielectric material.

In the operation shown in FIG. 52, the polycrystalline silicon dummy structures 90 and 100' are removed by etching while the gate sidewall spacers 150 remain not etched. In some embodiments of the present disclosure, wet etching using tetramethylammonium hydroxide (TMAH) is employed to remove the polycrystalline silicon dummy structures 90 and 100'.

The various embodiments or examples described herein offer several advantages over the existing art. For example, in the present disclosure, the fin end sidewall spacer layer 140 preserves the source/drain epitaxial layer 120 at fin end of the fin structure 80 even when overlay shift occurs and the spacer layers 150 is not completely formed due to the narrowness of the gap g.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a fin end spacer layer is formed on a surface of a lateral end of a fin. An insulating layer is formed on the fin end spacer layer. A dummy oxide layer is formed over the fin, the fin end spacer layer, and the insulating layer. Polycrystalline silicon layers are formed on a region in the fin and on an edge region of the fin at the lateral end. Sidewall spacer layers are formed on the polycrystalline silicon layers. A source/drain region of the fin structure is etched and is not covered by the sidewall spacer layers, thereby forming a source/drain space. A source/drain epitaxial layer is formed in the source/drain space. After the source/drain epitaxial layer is formed, a contact layer is formed and the polycrystalline silicon layers are etched. A gate electrode layer is formed. The gate electrode layer is isolated from the source/drain epitaxial layer by the sidewall spacer layers. In an embodiment, the fin end spacer layer and the sidewall spacer layer are formed of the same material. The material is a nano-material not etched during etching the polycrystalline silicon layers. The forming the polycrystalline silicon layers includes an overlay shift. The overlay shift changes a deposition position of one of the polycrystalline silicon layers from the edge region to a region away from the fin. The source/drain epitaxial layer includes Si—P in an embodiment.

In accordance with an aspect of the present disclosure, in a method of manufacturing a semiconductor device, a fin end spacer layer is formed on a surface of a lateral end of a fin. An insulating layer is formed on the fin end spacer layer. A dummy oxide layer is formed over the fin, the fin end spacer layer, and the insulating layer. Polycrystalline silicon layers are formed on a region in the fin and on a region away from the fin. Sidewall spacer layers are formed on the polycrystalline silicon layers. A source/drain region of the fin structure is etched and is not covered by the sidewall spacer layers, thereby forming a source/drain space. A source/drain epitaxial layer in the source/drain space is formed. After the source/drain epitaxial layer is formed, a contact layer is formed and the polycrystalline silicon layers are etched. A gate electrode layer is formed. The gate electrode layer is isolated from the source/drain epitaxial layer by the sidewall spacer layers. In an embodiment, the fin end spacer layer and the sidewall spacer layer are formed of the same material. The material is a nano-material not etched during etching the polycrystalline silicon layers. The forming the polycrystalline silicon layers includes an overlay shift. The overlay shift changes a deposition position of one of the polycrystalline silicon layers from the region away from the fin to a region closer to the fin. The source/drain epitaxial layer includes Si—P.

In accordance with another aspect of the present disclosure, a semiconductor device includes a plurality of fins on a substrate, fin end spacer on an end surface of each of the plurality of fins, an insulating layer on the plurality of fins, a source/drain epitaxial layer in a source/drain space in each of the plurality of fins, a gate electrode layer on the insulating layer and wrapping around the each channel region, and sidewall spacers on the gate electrode layer. The fin end spacer and the sidewall spacers are formed of the same material. The material is a nano-material not etched during an etching process forming the semiconductor device. In one or more of the foregoing or following embodiments, the semiconductor device also includes an overlay shift away from the plurality of fins. The overlay shift changes a position of gate electrode layer to a region away from the fin. In one or more of the foregoing or following embodiments, the semiconductor device includes an overlay shift toward the plurality of fins. The overlay shift changes a position of gate electrode layer to a region toward the fin. The source/drain epitaxial layer of the semiconductor device includes Si—P.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a fin end spacer layer on a surface of a lateral end of a fin;
    forming an insulating layer on the fin end spacer layer;
    forming a dummy oxide layer over the fin, the fin end spacer layer, and the insulating layer;
    forming polycrystalline silicon layers on a region of the fin and on an edge region of the fin at the lateral end;
    forming sidewall spacer layers on the polycrystalline silicon layers;
    etching a source/drain region of the fin, which is not covered by the sidewall spacer layers, thereby forming a source/drain space;
    forming a source/drain epitaxial layer in the source/drain space;
    after the source/drain epitaxial layer is formed, forming a contact layer and etching the polycrystalline silicon layers; and
    forming a gate electrode layer,
    wherein the gate electrode layer is isolated from the source/drain epitaxial layer by the sidewall spacer layers.

2. The method of claim 1, wherein the fin end spacer layer and the sidewall spacer layers are formed of the same material.

3. The method of claim 2, wherein the material is a nano-material not etched during etching the polycrystalline silicon layers.

4. The method of claim 1, wherein the forming the polycrystalline silicon layers includes forming a first hard mask layer.

5. The method of claim 4, the forming the polycrystalline silicon layers includes forming a second hard mask layer.

6. The method of claim 1, wherein the source/drain epitaxial layer includes Si—P.

7. A method of manufacturing a semiconductor device, comprising:
    forming a fin end spacer layer on a surface of a lateral end of a fin;
    forming an insulating layer on the fin end spacer layer;
    forming a dummy oxide layer over the fin, the fin end spacer layer, and the insulating layer;
    forming polycrystalline silicon layers on a region of the fin and on a region away from the fin;
    forming sidewall spacer layers on the polycrystalline silicon layers;
    etching a source/drain region of the fin, which is not covered by the sidewall spacer layers, thereby forming a source/drain space;
    forming a source/drain epitaxial layer in the source/drain space;
    after the source/drain epitaxial layer is formed, forming a contact layer on the source/drain epitaxial layer and etching the polycrystalline silicon layers; and
    forming a gate electrode layer on the region of the fin,
    wherein the gate electrode layer is isolated from the source/drain epitaxial layer by the sidewall spacer layers.

8. The method of claim 7, wherein the fin end spacer layer and the sidewall spacer layer are formed of the same material.

9. The method of claim 8, wherein the material is a nano-material not etched during etching the polycrystalline silicon layers.

10. The method of claim 7, wherein the forming the polycrystalline silicon layers includes forming a first hard mask layer.

11. The method of claim 10, wherein the forming the polycrystalline silicon layers includes forming a second hard mask layer.

12. The method of claim 7, wherein the source/drain epitaxial layer includes Si—P.

13. A semiconductor device, comprising:
    a plurality of fins on a substrate, each of the plurality of fins having side faces extending in a first direction and end faces disposed between the side faces;
    a fin end spacer on each end faces of each of the plurality of fins;
    an insulating layer on the plurality of fins;
    a source/drain epitaxial layer in a source/drain space in each of the plurality of fins;
    a gate electrode layer on the insulating layer and wrapping around a channel region of each of the plurality of fins, the gate electrode layer extending in a second direction crossing the first direction; and
    sidewall spacers on the gate electrode layer,
    wherein the source/drain epitaxial layer is disposed between the fin end spacer and the gate electrode layer in the first direction.

14. The semiconductor device of claim 13, wherein the fin end spacer and the sidewall spacers are formed of the same material.

15. The semiconductor device of claim 14, wherein the same material is a nano-material.

16. The semiconductor device of claim 13, wherein the fin end spacer shields the source/drain epitaxial layer.

17. The semiconductor device of claim 16, wherein the fin end spacer is formed of a material including silicon nitride.

18. The semiconductor device of claim 17, wherein the gate electrode layer is formed on a region toward the fin.

19. The semiconductor device of claim 16, wherein the gate electrode layer is formed on a region away from the fin.

20. The semiconductor device of claim 13, wherein the source/drain epitaxial layer includes Si—P.

* * * * *